US011569394B2

(12) United States Patent
Oh et al.

(10) Patent No.: US 11,569,394 B2
(45) Date of Patent: Jan. 31, 2023

(54) SOLAR CELL AND SOLAR CELL PANEL INCLUDING THE SAME

(71) Applicant: Shangrao Jinko solar Technology Development Co., LTD, Jiangxi (CN)

(72) Inventors: Donghae Oh, Seoul (KR); Jinsung Kim, Seoul (KR)

(73) Assignee: SHANGRAO JINKO SOLAR TECHNOLOGY DEVELOPMENT CO LTD, Jiangxi (CN)

(*) Notice: Subject to any disclaimer, the term of this patent is extended or adjusted under 35 U.S.C. 154(b) by 313 days.

(21) Appl. No.: 16/573,841

(22) Filed: Sep. 17, 2019

(65) Prior Publication Data
US 2020/0091351 A1  Mar. 19, 2020

(30) Foreign Application Priority Data

Sep. 18, 2018 (KR) .......................... 10-2018-0111664

(51) Int. Cl.
*H01L 31/02* (2006.01)
*H01L 31/0224* (2006.01)
(Continued)

(52) U.S. Cl.
CPC .. *H01L 31/0201* (2013.01); *H01L 31/022425* (2013.01); *H01L 31/048* (2013.01); *H01L 31/0504* (2013.01); *H01L 31/0508* (2013.01)

(58) Field of Classification Search
CPC ............. H01L 31/0201; H01L 31/0224; H01L 31/022433; H01L 31/0463; H01L 31/0465;
(Continued)

(56) References Cited

U.S. PATENT DOCUMENTS

2015/0007865 A1\* 1/2015 Steckemetz ......... H01L 31/0504
                                                                  136/244
2016/0093752 A1\* 3/2016 Kim .................... H01L 31/0504
                                                                  136/244
(Continued)

FOREIGN PATENT DOCUMENTS

CN   203733815 U   7/2014
CN   206742256 U   12/2017
(Continued)

OTHER PUBLICATIONS

First Office Action of corresponding Chinese Application No. 201910875996.3, dated Aug. 1, 2022, 19 pages.

*Primary Examiner* — Daniel P Malley, Jr.
(74) *Attorney, Agent, or Firm* — Tucker Ellis LLP

(57) ABSTRACT

A solar cell panel includes a plurality of solar cells including first and second solar cells, and a plurality of wiring members electrically connecting the first and second solar cells. A first electrode of each of the first and second solar cells includes a first bus bar including a plurality of first pad portions. The plurality of first pad portions include a first end pad positioned on one end side of the first bus bar and on which an end of the wiring member is positioned, and a first extension pad positioned on the other end side of the first bus bar and on an extension of the wiring member. An area of the first end pad is different from an area of the first extension pad.

12 Claims, 19 Drawing Sheets

(51) Int. Cl.
*H01L 31/048* (2014.01)
*H01L 31/05* (2014.01)

(58) Field of Classification Search
CPC ... H01L 31/042; H01L 31/05; H01L 31/0508;
H01L 31/0504; H01L 31/02013; H01L
31/0512; H01L 31/022425
See application file for complete search history.

(56) References Cited

U.S. PATENT DOCUMENTS

| | | |
|---|---|---|
| 2018/0090633 A1† | 3/2018 | Cho |
| 2018/0158970 A1† | 6/2018 | Yoon |
| 2019/0259885 A1* | 8/2019 | Yoshikawa ......... H01L 31/1804 |

FOREIGN PATENT DOCUMENTS

| | | |
|---|---|---|
| EP | 3091580 A1 | 11/2016 |
| JP | 2005-294679 A | 10/2005 |
| JP | 2010-16246 A | 1/2010 |
| JP | 2014-60311 A | 4/2014 |
| JP | 2015-70260 A | 4/2015 |
| JP | 2016-72637 A | 5/2016 |
| JP | 2018-93167 A | 6/2018 |
| KR | 10-1816154 B1 | 1/2018 |
| KR | 10-2018-0045262 A | 5/2018 |
| WO | WO 2012/001815 A1 | 1/2012 |
| WO | WO 2013/039158 A1 | 3/2013 |
| WO | WO 2013/100856 A2 | 7/2013 |

\* cited by examiner
† cited by third party

SOLAR CELL AND SOLAR CELL PANEL INCLUDING THE SAME

CROSS-REFERENCE TO RELATED APPLICATION

This application claims priority to and the benefit of Korean Patent Application No. 10-2018-0111664 filed in the Korean Intellectual Property Office on Sep. 18, 2018, the entire contents of which are incorporated herein by reference in its entirety.

BACKGROUND OF THE INVENTION

Field of the Invention

Embodiments of the invention relate to a solar cell and a solar cell panel including the same, and more particularly to a solar cell with an improved electrode structure and a solar cell panel including the same.

Description of the Related Art

A plurality of solar cells is connected in series or in parallel by a ribbon and is manufactured in the form of a solar cell panel by a packaging process for protecting the plurality of solar cells.

Various methods can be used to connect the solar cells. For example, the solar cells can be connected using a ribbon with a large width of about 1.5 mm. However, since a light loss can occur due to the large width of the ribbon, the number of ribbons disposed on the solar cells has to decrease. However, in this instance, electrical characteristics can be reduced due to an increase in a moving distance of carriers.

Hence, a structure was proposed to increase the number of wiring members using a wiring member with a width smaller than the width of the ribbon instead of the ribbon and to reduce a moving distance of carriers. However, adhesive properties of the wiring member can be reduced due to the small width of the wiring member. In particular, the adhesive properties of a wiring member can be reduced in a portion of the wiring member that is extended for the connection with another solar cell. When a width of electrodes entirely increases in order to improve the adhesive properties of the wiring member, there was a problem that an amount of material and a light loss increase due to an increase in an area of the electrode, and an open-circuit voltage is reduced due to an increase in a recombination that can occur in the electrode.

SUMMARY OF THE INVENTION

Embodiments of the invention provide a solar cell and a solar cell panel including the same capable of reducing an amount of electrode material, a light loss, and a recombination at an electrode while improving adhesive properties of a wiring member.

In particular, embodiments of the invention provide a solar cell and a solar cell panel including the same, considering that both edges of the solar cell can have different adhesive properties when a wiring member having a small width or a rounded shape is applied, capable of reducing an amount of electrode material, a light loss, and a recombination at an electrode while improving adhesive properties of a portion, in which adhesive properties can be relatively reduced, and improving adhesive properties of another portion through a reduction in an area of an electrode.

In one aspect, there is provided a solar cell panel including a plurality of solar cells including first and second solar cells, and a plurality of wiring members electrically connecting the first and second solar cells. A first electrode of each of the first and second solar cells includes a first bus bar including a plurality of first pad portions (wiring member connecters, area extension portions, or wide width portion). The plurality of first pad portions include a first end pad positioned on one end side of the first bus bar and on which an end of the wiring member is positioned, and a first extension pad positioned on other end side of the first bus bar and on an extension of the wiring member. An area of the first end pad is different from an area of the first extension pad. Here, each of the first and second solar cells can include a semiconductor substrate, a first conductive region positioned at one surface of the semiconductor substrate or on the one surface of the semiconductor substrate, and a first electrode electrically connected to the first conductive region. The first electrode can further include a plurality of first finger lines that are formed in a first direction and are parallel to each other. The first bus bar can include the plurality of first pad portions that are electrically connected to the first finger lines and are positioned in a second direction intersecting the first direction.

The first end pad and the first extension pad can be different from each other in an outer area or a total length in the second direction. Here, the outer area can mean an area of a single component if the first end pad or the first extension pad is included as a single component, and can mean an area of a portion entirely connecting two outermost sub-pads if the first end pad or the first extension pad includes a plurality of sub-pads. The total length can mean a distance between both ends of a single component in the second direction if the first end pad or the first extension pad is included as a single component, and can mean a distance between both ends of two outermost sub-pads in the second direction if the first end pad or the first extension pad includes a plurality of sub-pads.

A sum of total overlapping areas (a sum of total formation areas of the first end pad) of the first end pad and the wiring member can be different from a sum of total overlapping areas (a sum of total formation areas of the first extension pad) of the first extension pad and the wiring member. Alternatively, a sum of total overlapping lengths (a sum of total formation lengths of the first end pad) of the first end pad and the wiring member can be different from a sum of total overlapping lengths (a sum of total formation lengths of the first end pad) of the first extension pad and the wiring member.

At least one of the first end pad and the first extension pad can include a plurality of sub-pads, and the first end pad and the first extension pad can be different from each other in a number of pads.

An outer area of the first extension pad can be greater than an outer area of the first end pad. Alternatively, a sum of total overlapping areas of the first extension pad and the wiring member can be greater than a sum of total overlapping areas of the first end pad and the wiring member.

A total length of the first extension pad in the second direction can be greater than a total length of the first end pad in the second direction. Alternatively, a sum of total overlapping lengths of the first extension pad and the wiring member can be greater than a sum of total overlapping lengths of the first end pad and the wiring member.

The plurality of first pad portions can further include a first inner pad between the first end pad and the first extension pad. The outer area or a formation area of the first end pad can be equal to or greater than an outer area of the first inner pad, and the outer area or a formation area of the first extension pad can be greater than an area of the first inner pad.

Each of the first and second solar cells can further include a second conductive region positioned at other surface of the semiconductor substrate or on the other surface of the semiconductor substrate, and a second electrode electrically connected to the second conductive region. The second electrode can include a second bus bar including a plurality of second pad portions positioned in the second direction. The plurality of second pad portions can include a second extension pad positioned on one end side of the second bus bar, and a second end pad positioned on other end side of the second bus bar. An outer area of the second extension pad can be greater than an outer area of the second end pad, or a sum of total overlapping areas of the second extension pad and the wiring member can be greater than a sum of total overlapping areas of the second end pad and the wiring member.

An end of the first extension pad can be the same as an end of the second end pad or can be positioned more inside than the end of the second end pad.

The first and second solar cells each can have a long axis and a short axis. The first direction can be parallel to the long axis of the first and second solar cells and the second direction can be parallel to the short axis of the first and second solar cells, such that the wiring members can connect the first and second solar cells along the short axis.

The number of the plurality of wiring members based on one surface of the solar cell in the first direction can be 6 to 33, or a width of each of the plurality of wiring members can be 250 μm to 500 μm, or the plurality of wiring members can have a cross-sectional shape including a circular or rounded portion.

A width of each of the plurality of wiring members can be greater than a width of the first finger line in the second direction and can be less than a width of the first pad portion in the first direction.

In another aspect, there is provided a solar cell including a semiconductor substrate, a first conductive region positioned at one surface of the semiconductor substrate or on the one surface of the semiconductor substrate, and a first electrode electrically connected to the first conductive region. The first electrode includes a first bus bar including a plurality of first pad portions (wiring member connecters, area extension portions, or wide width portion). The plurality of first pad portions include a first one end pad positioned on one end side of the first bus bar, and a first other end pad positioned on the other end side of the first bus bar. An area of the first one end pad is different from an area of the first other end pad. The first electrode can further include a plurality of first finger lines that are formed in a first direction and are parallel to each other. The first bus bar can include a plurality of first pad portions that are electrically connected to the first finger lines and are positioned in a second direction intersecting the first direction.

The first one end pad and the first other end pad can be different from each other in an outer area or a total length in the second direction.

A sum of total formation areas of the first one end pad can be different from a sum of total formation areas of the first other end pad. A sum of total formation lengths of the first one end pad can be different from a sum of total formation lengths of the first other end pad.

At least one of the first one end pad and the first other end pad can include a plurality of sub-pads, and the first one end pad and the first other end pad can be different from each other in a number of pads.

An outer area of the first other end pad can be greater than an outer area of the first one end pad. A sum of total formation areas of the first other end pad can be greater than a sum of total formation areas of the first one end pad.

A total length of the first other end pad in the second direction can be greater than a total length of the first one end pad in the second direction. A sum of total formation lengths of the first other end pad in the second direction can be greater than a sum of total formation lengths of the first one end pad in the second direction.

The solar cell can further include a second conductive region positioned at other surface of the semiconductor substrate or on the other surface of the semiconductor substrate, and a second electrode electrically connected to the second conductive region. The second electrode can include a second bus bar including a plurality of second pad portions positioned in the second direction. The plurality of second pad portions can include a second one end pad positioned on one end side of the second bus bar, and a second other end pad positioned on other end side of the second bus bar. An outer area of the second one end pad can be greater than an outer area of the second other end pad. Alternatively, a sum of total formation areas of the second one end pad can be greater than a sum of total formation areas of the second other end pad.

The solar cell can have a long axis and a short axis. The first direction can be parallel to the long axis and the second direction can be parallel to the short axis, such that the plurality of first pad portions included in the first bus bar can be positioned on the short axis.

BRIEF DESCRIPTION OF THE DRAWINGS

The accompanying drawings, that can be included to provide a further understanding of the invention and are incorporated in and constitute a part of this specification, illustrate embodiments of the invention and together with the description serve to explain various principles of the invention.

DETAILED DESCRIPTION OF THE EMBODIMENTS

Figure 1:
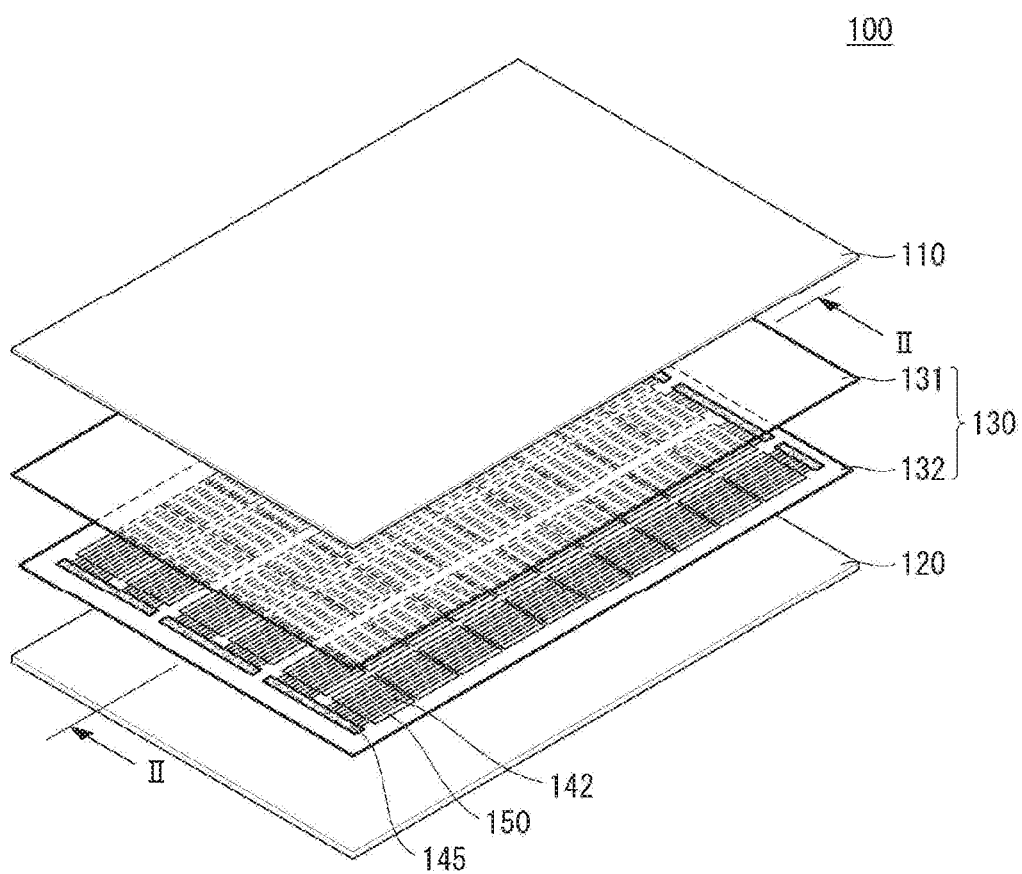
FIG. 1 is a perspective view illustrating a solar cell panel according to an embodiment of the invention.

Reference will now be made in detail to embodiments of the invention, examples of which are illustrated in the accompanying drawings. This invention can, however, be embodied in many different forms and should not be construed as limited to the embodiments set forth herein.

In the drawings, illustration of parts unrelated to embodiments of the invention is omitted for clarity and simplicity of description. The same reference numerals designate the same or very similar elements throughout the specification. In the drawings, thickness, width, etc. of elements are exaggerated or reduced for clarity of description, and should not be construed as limited to those illustrated in the drawings.

It will be understood that the terms "comprise" and/or "comprising," or "include" and/or "including" used in the specification specify the presence of stated elements, but do not preclude the presence or addition of one or more other elements. In addition, it will be understood that, when an element such as a layer, film, region, or plate is referred to as being "on" another element, it can be directly disposed on another element or can be disposed such that an intervening element is also between them. Accordingly, when an element such as a layer, film, region, or plate is disposed "directly on" another element, this means that there is no intervening element between the elements.

Hereinafter, a solar cell and a solar cell panel including the same according to embodiments of the invention will be described in detail with reference to the accompanying drawings. In the following, the expressions such as "first", "second", and "third" are used to distinguish each other, but embodiments of the invention are not limited thereto.

Figure 2:
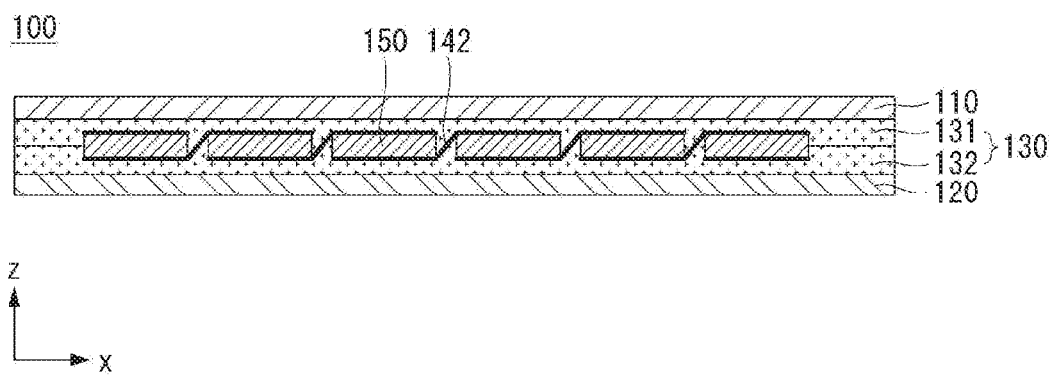
FIG. 2 is a cross-sectional view taken along line II-II of FIG. 1.

FIG. 1 is a perspective view illustrating a solar cell panel according to an embodiment of the invention. FIG. 2 is a cross-sectional view taken along line II-II of FIG. 1.

Referring to FIGS. 1 and 2, a solar cell panel 100 according to an embodiment of the invention includes a plurality of solar cells 150 and wiring members (or wires, interconnectors, etc.) 142 for electrically connecting the plurality of solar cells 150. The solar cell panel 100 further includes a sealing member 130 that surrounds and seals the plurality of solar cells 150 and the wiring members (or the interconnectors) 142 for connecting the solar cells 150, a first cover member 110 positioned on the sealing member 130 and on front surfaces of the solar cells 150, and a second cover member 120 positioned on the sealing member 130 and on back surfaces of the solar cells 150. This will be described in more detail.

The solar cell 150 can include a photoelectric conversion unit that converts solar energy into electric energy, and electrodes that are electrically connected to the photoelectric conversion unit to collect and transfer a current. The plurality of solar cells 150 can be electrically connected in series, parallel, or series-parallel by the wiring member 142. Specifically, the wiring member 142 electrically connects two neighboring solar cells 150 among the plurality of solar cells 150.

Bus ribbons 145 alternately connect both ends (or opposite ends) of the wiring members 142 of the solar cells 150 (i.e., a solar cell string) that are connected by the wiring members 142 to form one row. The bus ribbon 145 can be disposed at an end of the solar cell string in a direction intersecting the solar cell string. The bus ribbon 145 can connect the solar cell strings adjacent to each other, or connect the solar cell string or the solar cell strings to a junction box that prevents reverse flow of current. A material, a shape, a connection structure, etc. of the bus ribbon 145 can be variously modified, and embodiments of the invention are not limited thereto.

The sealing member 130 can include a first sealing member 131 on the front surfaces of the solar cells 150 connected by the wiring member 142, and a second sealing member 132 on the back surfaces of the solar cells 150 connected by the wiring member 142. The first sealing member 131 and the second sealing member 132 prevent moisture and oxygen from entering and chemically combine the respective components of the solar cell panel 100. The first and second sealing members 131 and 132 can be made of an insulating material with transparency and adhesiveness. For example, the first sealing member 131 and the second sealing member 132 can use an ethylene-vinyl acetate copolymer resin (EVA), polyvinyl butyral, a silicon resin, an ester-based resin, an olefin-based resin, or the like. The second cover member 120, the second sealing member 132, the solar cells 150, the first sealing member 131, and the first cover member 110 can be integrated by a lamination process or the like using the first and second sealing members 131 and 132 to form the solar cell panel 100.

The first cover member 110 is positioned on the first sealing member 131 to form a front surface of the solar cell panel 100, and the second cover member 120 is positioned on the second sealing member 132 to form a back surface of the solar cell 150. The first cover member 110 and the second cover member 120 can be made of an insulating material capable of protecting the solar cells 150 from external shock, moisture, ultraviolet rays, or the like. The first cover member 110 can be made of a light transmitting material capable of transmitting light, and the second cover member 12.0 can be made of a sheet formed of a light transmitting material, a non-light transmitting material, or a reflective material. For example, the first cover member 110 can be formed of a glass substrate or the like, and the second cover member 120 can have a TPT (Tedlar/PET/Tedlar) type or include a polyvinylidene fluoride (PVDF) resin layer formed on at least one surface of a base film (e.g., polyethylene terephthalate (PET)).

However, embodiments are not limited thereto. For example, the first and second sealing members 131 and 132, the first cover member 110, or the second cover member 120 can include various materials other than those described above, and can have various shapes. For example, the first cover member 110 or the second cover member 120 can have various shapes (e.g., a substrate, a film, a sheet, etc.) or materials.

Figure 3:
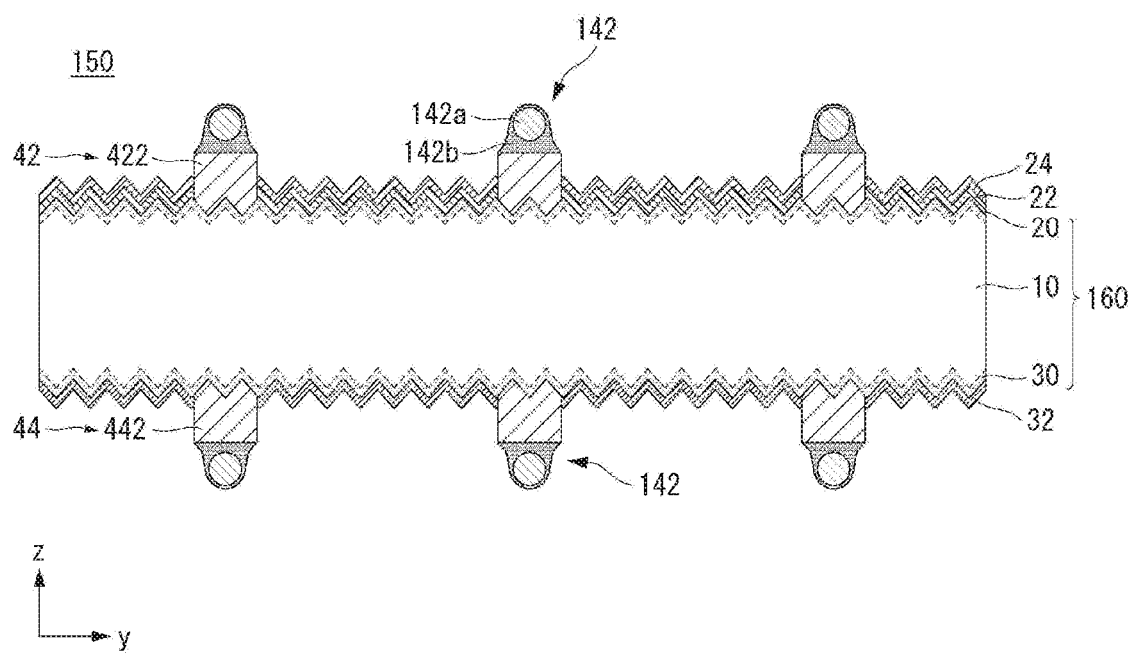
FIG. 3 is a partial cross-sectional view illustrating a solar cell and a wiring member connected to the solar cell which are included in a solar cell panel shown in FIG. 1.

The solar cell 150 according to an embodiment of the invention and the wiring member 142 connected to the solar cell 150 are described in more detail with reference to FIG. 3. FIG. 3 is a partial cross-sectional view illustrating the solar cell 150 and the wiring member 142 connected to the solar cell 150 which are included in the solar cell panel 100 shown in FIG. 1. Electrodes 42 and 44 are schematically shown in FIG. 3 for the brief illustration.

Referring to FIG. 3, the solar cell 150 includes a semiconductor substrate 160, conductive regions 20 and 30 formed at or on the semiconductor substrate 160, and electrodes 42 and 44 connected to the conductive regions 20 and 30. The conductive regions 20 and 30 can include a first conductive region 20 with a first conductivity type and a second conductive region 30 with a second conductivity type. The electrodes 42 and 44 can include a first electrode 42 connected to the first conductive region 20 and a second electrode 44 connected to the second conductive region 30. The solar cell 150 can further include first and second passivation layers 22 and 32, an anti-reflection layer 24, and the like.

The semiconductor substrate 160 can be formed of a crystalline semiconductor (e.g., single crystal or polycrystalline semiconductor, e.g., single crystal or polycrystalline silicon) including a single semiconductor material (e.g., group IV element). Hence, since the solar cell 150 is based on the semiconductor substrate 160 having few defects due to a high degree of crystallinity, the solar cell 150 can have excellent electrical characteristics.

A front surface and/or a back surface of the semiconductor substrate 160 can be textured to have unevenness portions. For example, the unevenness portion can have a pyramid shape, having an irregular size, whose outer surface is formed of a (111) surface of the semiconductor substrate 160. As a result, the semiconductor substrate 160 can reduce a reflectance of light due to a relatively large surface roughness. However, embodiments are not limited thereto.

In the present embodiment, the semiconductor substrate 160 includes a base region 10 with the first or second conductivity type by doping a first or second conductivity type dopant than the first or second conductive region 20 or 30 at a lower doping concentration. For example, the base region 10 can have the second conductivity type in the present embodiment.

For example, the first conductive region 20 can form an emitter region that forms a p-n junction with the base region 10. The second conductive region 30 can form a back surface field to form a back surface field region for preventing recombination. In embodiments, the first and second conductive regions 20 and 30 can be entirely formed on the front surface and the back surface of the semiconductor substrate 160. Thus, the first and second conductive regions 20 and 30 can be formed with a sufficient area without additional patterning. However, embodiments are not limited thereto.

In the present embodiment, the base region 10 and the conductive regions 20 and 30 constituting the semiconductor substrate 160 are exemplified as regions having a crystalline structure of the semiconductor substrate 160 and having different conductivity types, different doping concentrations, etc. That is, the conductive regions 20 and 30 are illustrated as doped regions constituting a part of the semiconductor substrate 160. However, embodiments are not limited thereto. Therefore, at least one of the first conductive region 20 and the second conductive region 30 can be formed of an amorphous, microcrystalline or polycrystalline semiconductor layer or the like, which is formed, as a separate layer, on the semiconductor substrate 160. Other variations can be used.

The first conductivity type dopant included in the first conductive region 20 can be an n-type or p-type dopant, and the second conductivity type dopant included in the base region 10 and the second conductive region 30 can be a p-type or n-type dopant. The p-type dopant can use a group III element such as boron (B), aluminum (Al), gallium (Ga), or indium (In), and the n-type dopant can use a group V element such as phosphorus (P), arsenic (As), bismuth (Bi), or antimony (Sb). The second conductivity type dopant of the base region 10 and the second conductivity type dopant of the second conductive region 30 can be the same material or different materials.

For example, the first conductive region 20 can have a p-type, and the base region 10 and the second conductive region 30 can have an n-type. Hence, holes having a slower moving speed than electrons move to the front surface of the semiconductor substrate 160 not the back surface of the semiconductor substrate 160, thereby improving conversion efficiency. However, embodiments are not limited thereto, and vice versa is also possible.

An insulating layer such as the first and second passivation layers 22 and 32 for immobilizing defects of the conductive regions 20 and 30 and the anti-reflection layer 24 for preventing reflection of light can be formed on the surface of the semiconductor substrate 1.60. The insulating layer can be formed of an undoped insulating layer which does not contain a dopant separately. The first and second passivation layers 22 and 32 and the anti-reflection layer 24 can be formed substantially entirely on the front surface and the back surface of the semiconductor substrate 160 except for a portion (more specifically, a portion where a first or second opening is formed) corresponding to the first or second electrode 42 or 44.

For example, the first or second passivation layer 22 or 32 or the anti-reflection layer 24 can be formed of a silicon nitride layer, a silicon nitride layer containing hydrogen, a silicon oxide layer, a silicon oxynitride layer, an aluminum oxide layer, and any one single layer selected from a group consisting of $MgF_2$, $ZnS$, $TiO_2$ and $CeO_2$ or a multi-layered structure in which two or more layers are combined. For example, the first or second passivation layer 22 or 32 can include a silicon oxide layer, a silicon nitride layer, or the like having fixed positive charges if the first or second conductive region 20 or 30 has an n-type, and can include an aluminum oxide layer, or the like having fixed negative charges if the first or second conductive region 20 or 30 has a p-type. For example, the anti-reflection layer 24 can include silicon nitride. In addition, a material, a stacking structure, etc. of the insulating layer can be variously changed.

The first electrode 42 is electrically connected to the first conductive region 20 through a first opening, and the second electrode 44 is electrically connected to the second conductive region 30 through a second opening. The first and second electrodes 42 and 44 can be formed of various materials (e.g., metal material) and can have various shapes. The shape of the first and second electrodes 42 and 44 will be described later.

As described above, in the present embodiment, the first and second electrodes 42 and 44 of the solar cell 150 have a predetermined pattern, and the solar cell 150 has a bi-facial structure in which light can be incident on both the front surface and the back surface of the semiconductor substrate 160. Hence, the present embodiment can increase an amount of light used in the solar cell 150 to contribute to the efficiency improvement of the solar cell 150.

However, embodiments are not limited thereto. For example, the second electrode 44 can be formed entirely on the back surface of the semiconductor substrate 160. Further, the first and second conductive regions 20 and 30 and the first and second electrodes 42 and 44 can be positioned together on one surface (e.g., the back surface) of the semiconductor substrate 160, and at least one of the first and second conductive regions 20 and 30 can be formed over both surfaces of the semiconductor substrate 160. That is, the solar cell 150 described above is merely an example, and embodiments are not limited thereto.

The solar cell 150 described above is electrically connected to the neighboring solar cell 150 by the wiring member 142 positioned on (e.g., in contact with) the first electrode 42 or the second electrode 44. This will be described in more detail with reference to FIG. 4 together with FIGS. 1 to 3.

Figure 4:
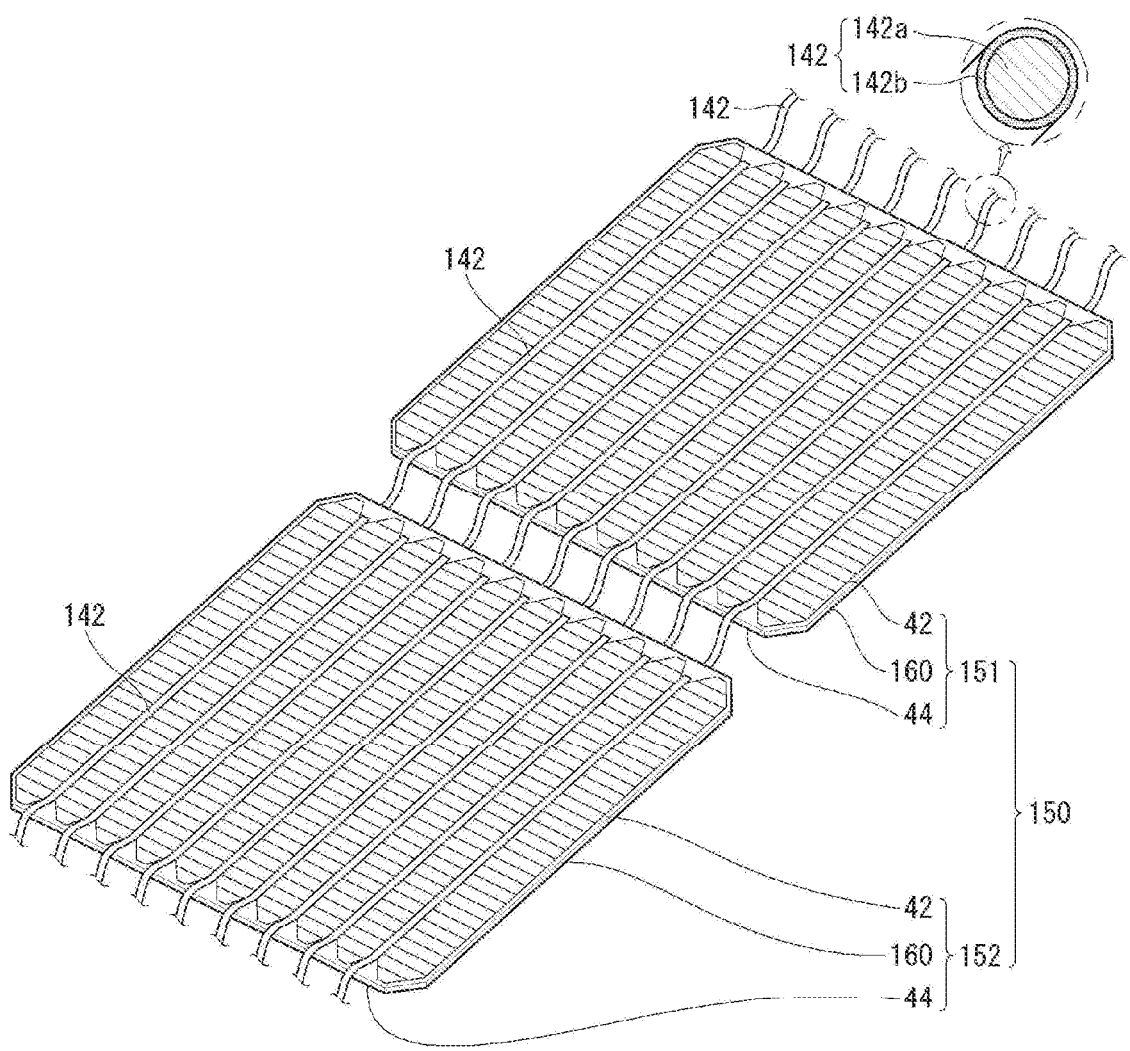
FIG. 4 is a perspective view schematically illustrating a first solar cell and a second solar cell which are included in a solar cell panel shown in FIG. 1 and are connected by a wiring member.

FIG. 4 is a perspective view schematically illustrating a first solar cell 151 and a second solar cell 152 which are included in the solar cell panel 100 shown in FIG. 1 and are connected by a wiring member 142. In FIG. 4, the first and second solar cells 151 and 152 are schematically illustrated focusing on a semiconductor substrate 160 and electrodes 42 and 44.

As illustrated in FIG. 4, a wiring member 142 connects a first electrode 42 on a front surface of the first solar cell 151 to a second electrode 44 on a back surface of the second solar cell 152 positioned at one side (e.g., the left lower part in FIG. 4) of the first solar cell 151. Another wiring member 142 connects a second electrode 44 on a back surface of the first solar cell 151 to a first electrode 42 on a front surface of another solar cell to be positioned on another side (e.g., the right upper part in FIG. 4) of the first solar cell 151. Another wiring member 142 connects a first electrode 42 on a front surface of the second solar cell 152 to a second electrode 44 on a back surface of another solar cell to be positioned at one side (e.g., the left lower part in FIG. 4) of the second solar cell 152. Thus, a plurality of solar cells 150 can be connected to each other by the wiring members 142 to form one row. Hereinafter, the description of the wiring member 142 can be applied to all the wiring members 142 connecting the two neighboring solar cells 150.

In this instance, the plurality of wiring members 142 on one surface of each solar cell 150 is positioned to be extended along one direction (e.g., an x-axis direction in FIG. 4, a direction intersecting a first finger line (denoted as reference numeral 42*a* in FIG. 5, hereafter the same), or an extending direction of a first bus bar (denoted as reference numeral 42*b* in FIG. 5, hereafter the same)), and thus can improve electrical connection characteristics of the neighboring solar cells 150.

In the present embodiment, the wiring member 142 can be formed of a wire having a width smaller than that of a ribbon having a relatively wide width (e.g., 1 mm to 2 mm) which has been used previously. For example, a maximum width of the wiring member 142 can be 1 μm or less (e.g., 500 μm or less, more specifically, 250 μm to 500 μm). In embodiments, the maximum width of the wiring member 142 can mean a largest width among widths passing the center of the wiring member 142. When the wiring member 142 has the above-described maximum width, the wiring member 142 can be smoothly attached to the solar cell 150 while keeping a resistance low and minimizing a light loss.

The present embodiment can use more wiring members 142 than the number (e.g., 2 to 5) of existing ribbons based on one surface of each solar cell 150. Hence, the present embodiment can reduce a moving distance of carriers by the large number of wiring members 142 while minimizing the light loss and the material cost due to the wiring member 142 with the small width. As a result, the present embodiment can improve the efficiency of the solar cell 150 and an output of the solar cell panel 100 by reducing the moving distance of carriers while reducing the light loss, and can improve the productivity of the solar cell panel 100 by reducing the material cost resulting from the wiring member 142.

In the present embodiment, in order to prevent a process of attaching the wiring member 142 to the solar cell 150 from being complicated when the large number of wiring members 142 with the small width are used as described above, the wiring member 142 can have a structure including a core layer 142*a* and a solder layer 142*b* formed on the surface of the core layer 142*a*. Then, the large number of wiring members 142 can be effectively attached to the solar cell 150 by a process of applying heat and pressure in a state where the plurality of wiring members 142 is placed on the solar cell 150.

The wiring member 142 or the core layer 142*a* which is included in the wiring member 142 and occupies most of the wiring member 142 can include a rounded portion. That is, at least a portion of a cross section of the wiring member 142 or the core layer 142*a* can include a circular portion, a part of a circular portion, an oval portion, a part of an oval portion, or a curved portion.

If it has the above-described shape, the wiring member 142 is formed such that the solder layer 142*b* is entirely positioned on the surface of the core layer 142*a*. Hence, a process of separately applying a solder material, etc. are omitted, and the wiring member 142 is positioned directly on the solar cell 150 and can be attached to the solar cell 150. As a result, the process of attaching the wiring member 142 can be simplified. In addition, light reflected from the wiring member 142 is re-incident on the solar cell 150 by the reflection or the diffuse reflection at the rounded portion of the wiring member 142, and can be reused. Thus, since an amount of light incident on the solar cell 150 increases, the efficiency of the solar cell 150 and the output of the solar cell panel 100 can be improved. However, embodiments are not limited thereto. For example, the wire constituting the wiring member 142 can have a polygonal shape such as a quadrangle or can have various other shapes.

In this instance, the number of wiring members 142 can be 6 to 33 (e.g., 8 to 33, for example, 10 to 33, particularly 10 to 15) based on one surface of the solar cell 150, and the wiring members 142 can be spaced apart from each other at a uniform distance. The plurality of wiring members 142 in each solar cell 150 can have a symmetrical shape when viewed from an extending direction of the first finger line 42a. Thus, the present embodiment can minimize the movement distance of carriers while providing a sufficient number of wiring members 142.

In the present embodiment, the wiring member 142 can include the core layer 142a made of metal and the solder layer 142b that is formed on the surface of the core layer 142a and includes a solder material to enable soldering with the electrodes 42 and 44. That is, the solder layer 142b can serve as a kind of adhesive layer. For example, the core layer 142a can contain Ni, Cu, Ag, Al, etc. as a main material (e.g., material contained up to 50 wt % or more, more specifically, material contained up to 90 wt % or more). The solder layer 142b can contain a solder material such as Pb, Sn, SnIn, SnBi, SnPb, SnPbAg, SnCuAg, and SnCu as a main material. However, embodiments are not limited thereto. For example, the core layer 142a and the solder layer 142b can contain various materials.

If the wiring member 142 is attached to the solar cell 150 by a tabbing process, a shape of the solder layer 142b is changed around the wiring member 142 attached to or connected to the solar cell 150 as illustrated in FIG. 3.

More specifically, the wiring member 142 is attached to at least pad portions 422 and. 442 by the solder layer 142b. In this instance, a solder layer 142b of each wiring member 142 is positioned separately from another wiring member 142 or another solder layer 142b. When the wiring member 142 is attached to the solar cell 150 by the tabbing process, each solder layer 142b can entirely flow down to the first or second electrode 42 or 44 (more specifically, the pad portions 422 and 424) during the tabbing process, and a width of the solder layer 142b can gradually increase toward the pad portions 422 and 442 in a portion adjacent to each of the pad portions 422 and 442 or a portion between the pad portions 422 and 442 and the core layer 142a. For example, the portion adjacent to the pad portions 422 and 442 in the solder layer 142b can have a width equal to or greater than a diameter of the core layer 142a. In this instance, a width of the solder layer 142b can be equal to or less than a width of the pad portions 422 and 442.

More specifically, the solder layer 142b has a shape protruding toward the outside of the solar cell 150 along the shape of the core layer 142a at the upper part of the core layer 142a. On the other hand, the solder layer 142b includes a portion having a shape recessed to the outside of the solar cell 150 at the lower part of the core layer 142a or a portion adjacent to the pad portions 422 and 442. Hence, an inflection point where the curvature changes is positioned on the side of the solder layer 142b. It can be seen from the above shape of the solder layer 142b that the wiring members 142 are individually attached and fixed by the solder layer 142b without being inserted into or covered with a separate layer, film, or the like. The solar cell 150 and the wiring members 142 can be connected through a simple structure and a simple process by fixing the wiring member 142 by the solder layer 142b without using a separate layer, film, etc. In particular, as in the present embodiment, the wiring member 142 having a narrow width and a rounded shape can be attached without using a separate layer, film, etc. (e.g., a conductive adhesive film including a resin and a conductive material), and thus the process cost and time of the wiring member 142 can be minimized.

A portion of the wiring member 142 between the neighboring solar cells 150 (i.e., outside the solar cell 150), which is not subjected to heat or is applied with relatively less heat even after the tabbing process, can have a shape in which the solder layer 142b has a uniform thickness as illustrated in FIG. 4.

According to the, present embodiment, the light loss can be minimized by the diffuse reflection, etc. using the wire-shaped wiring material 142, and a movement path of the carrier can decrease by increasing the number of wiring members 142 and reducing a pitch of the wiring member 142. In addition, the present embodiment can greatly reduce the material cost by reducing the width or the diameter of the wiring member 142. As a result, the efficiency of the solar cell 150 and the output of the solar cell panel 100 can be improved.

Figure 5:
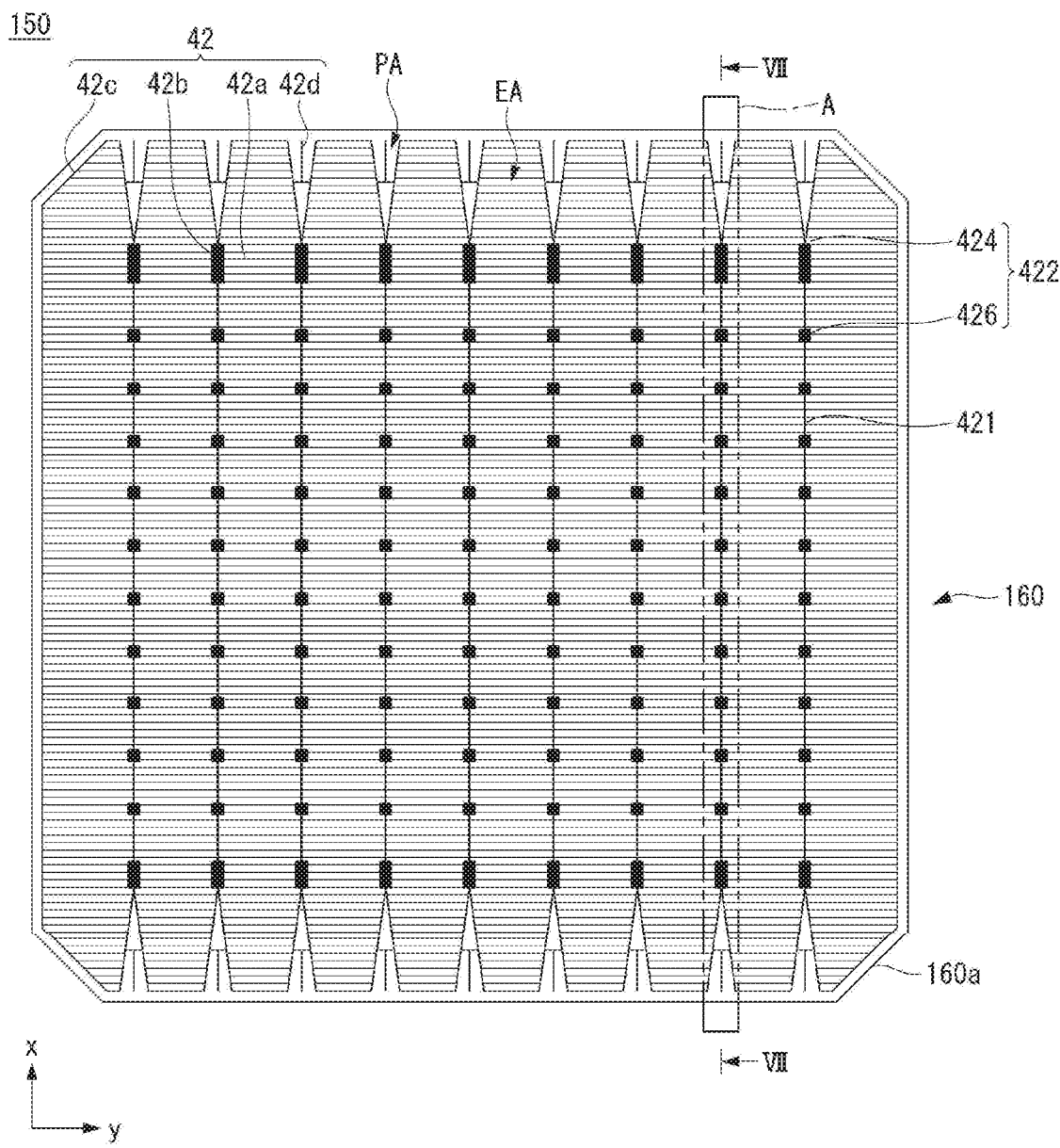
FIG. 5 is a front plan view of a solar cell shown in FIG. 4.

An example of the electrodes 42 and 44 of the solar cell 150, to which the wiring member 142 according to an embodiment of the invention is attached, is described in detail with reference to FIG. 5 together with FIGS. 1 to 4. With reference to FIG. 5, the following description is described focusing on the first electrode 42, and the second electrode 44 that is the same as or similar to the first electrode 42 and is different from the first electrode 42 is described below.

FIG. 5 is a front plan view of the solar cell 140 shown in FIG. 4.

Referring to FIGS. 1 to 5, in the present embodiment, the first electrode 42 includes a plurality of first finger lines 42a that is extended in a first direction (e.g., a y-axis direction in the drawing) and is positioned parallel to each other, and a first bus bar 42b that is formed in a second direction (e.g., an x-axis direction in the drawing) intersecting (e.g., perpendicular to) the first finger lines 42a, is electrically connected to the first finger lines 42a, and is connected or attached to the wiring member 142. FIG. 5 illustrates that the first electrode 42 further includes a rim line 42c that is positioned around both edges (or opposite edges) and entirely connects ends of the plurality of first finger lines 42a. The rim line 42c can have a width equal or similar to the first finger line 42a and can be formed of the same material as the first finger line 42a. However, the first electrode 42 need not include the rim line 42c.

In this instance, in the present embodiment, the solar cell 150 (or the semiconductor substrate 160) can be partitioned into an electrode area EA and an edge area PA. In embodiments, the electrode area EA can be an area in which the first finger lines 42a formed in parallel to each other are arranged at a uniform pitch. The electrode area EA can include a plurality of electrode areas EA partitioned by the wiring member 142. The edge area PA is an area that is positioned between two adjacent electrode areas EA and is positioned adjacent to an edge of the semiconductor substrate 160 or the solar cell 150 outside a plurality of first pad portions 422 (particularly, a first outer pad 424). In this instance, the edge area. PA can be an area where an electrode portion 42d is positioned at a density lower than a density of the first finger line 42a of the electrode area EA, or an area where the electrode portion 42d is not positioned. FIG. 5 illustrates that the electrode portions 42d on either side have the same shape. However, embodiments are not limited thereto, and various other modifications are possible.

In the present embodiment, at least a portion of the plurality of first finger lines 42a includes a contact portion, which is in direct contact with the first conductive region 20, and serve to collect carriers generated by the photoelectric conversion from the first conductive region 20. For example, the plurality of first finger lines 42a can be extended in parallel to each other and spaced apart from each other so as to have a predetermined pitch.

In the present embodiment, the first bus bar 42b can include a plurality of first pad portions 422 positioned in the second direction, and can further include a first line portion 421 which is elongated with a relatively narrow width along a direction in which the wiring member 142 is connected. The first pad portion 422 can improve the adhesion with the wiring member 142 and reduce a contact resistance, and the first line portion 421 can minimize a light loss. The first line portion 421 can provide a path that carriers can bypass when some of the first finger lines 42a are disconnected. The wiring member 142 can be attached to the first line portion 421, and the wiring member 142 can be placed on the first line portion 421 in a state where the wiring member 142 is not attached in the first line portion 421.

More specifically, the plurality of first pad portions 422 includes the first outer pad 424 that is positioned adjacent to the edge of the semiconductor substrate 160 in the second direction, and a first inner pad 426 that is positioned more inside than the first outer pad 424. In embodiments, the first outer pad 424 can mean two pads positioned closest to each of both edges (or opposite edges) among the plurality of first pad portions 422 when viewed from the second direction, and the first inner pad 426 can mean a pad between the two first outer pads 424. In embodiments, since the outer pad and the inner pad are distinguished based on the plurality of first pad portions 422, the first line portion 421 can be positioned outside the outer pad 424, unlike the drawing.

A width of the first pad portion 422 in the first direction can be greater than a width of the first line portion 421 in the first direction and a width of the first finger line 42a in the second direction. A length of the first pad portion 422 in the first direction can be greater than the width of the first line portion 421 in the first direction and the width of the first finger line 42a in the second direction. The width of the first line portion 421 can be equal to or less than a width of the wiring member 142, and the width of the first pad portion 422 can be equal to or greater than the width of the wiring member 142. As described above, if the first pad portion 422 has a sufficient width, the first pad portion 422 can improve the adhesion with the wiring member 142 and reduce the contact resistance. The width of the wiring member 142 can be less than a pitch of the first finger line 42a and can be greater than the width of the first finger line 42a. However, embodiments are not limited thereto, and various modifications are possible.

In this instance, a plurality of inner pads 426 can be arranged at a predetermined distance in each first bus bar 42b. For example, 6 to 40 (e.g., 12 to 24) first inner pads 426 can be arranged in each first bus bar 42b. In embodiments, each first inner pad 426 can be positioned at every one of the plurality of first finger lines 42a, and for example, a pitch of the first inner pad 426 can be 2 to 20 times (e.g., than more 3 times, 10 times or less) the pitch of the first finger line 42a. However, the number, the arrangement, etc. of the first inner pads 426 can be variously changed. FIG. 5 illustrates that the inner pads 426 are spaced at equal intervals, but embodiments are not limited thereto. For example, the number and the density of the first inner pads 426 can increase in a portion where a large force acts thereon, and the pitch, the interval or both of the first finger line 42a can vary.

Similar to the first electrode 42, the second electrode 44 can include a second pad portion 442, a second line portion 441, or a second bus bar 44b respectively corresponding to the first pad portion 422, the first line portion 421, or the first bus bar 42b, and can further include a second finger line 44a corresponding to the first finger line 42a of the first electrode 42. In this instance, the widths, the pitches, the thicknesses, etc. of the first finger line 42a, the first pad portion 422, and the first line portion 421 of the first electrode 42 can be the same as or different from widths, pitches, thicknesses, etc. of the second finger line 44a, the second pad portion 442, and the second line portion 441 of the second electrode 44. The first bus bar 42b and a second bus bar 44b can be formed at the same position and in the same number. The second electrode 44 can further include a rim line and/or an electrode portion corresponding to the rim line 42c and/or the electrode portion 42d of the first electrode 42. Without any other description, the description of the first electrode 42 can be applied to the second electrode 44, and a description of a first insulating layer (e.g., the first passivation layer 22, the anti-reflection layer 24, etc. formed on the front surface of the semiconductor substrate 160) related to the first electrode 42 can be applied to a second insulating layer (e.g., the second passivation layer 32 formed on the back surface of the semiconductor substrate 160) related to the second electrode 44.

For example, in the present embodiment, the first or second finger line 42a or 44a of the first or second electrode 42 or 44 can be formed to pass through the insulating layer and contact the first or second conductive region 20 or 30. The first or second bus bar 42b or 44b of the first or second electrode 42 or 44 can be formed to pass through the insulating layer and contact the first or second conductive region 20 or 30, and the first or second bus bar 42b and 44b on the insulating layer can be spaced apart from the first or second conductive region 20 or 30. In this instance, when viewed from a cross section, the first and second finger lines 42a and 44a and/or the first and second bus bars 42b and 44b at the first and second electrodes 42 and 44 can be the same as or different from each other in terms of the structure.

A detailed structure of the first and second outer pads 424 and 444 according to embodiments and various modified examples of the invention is described with reference to FIGS. 6 and 7 together with FIG. 5.

Figure 6:
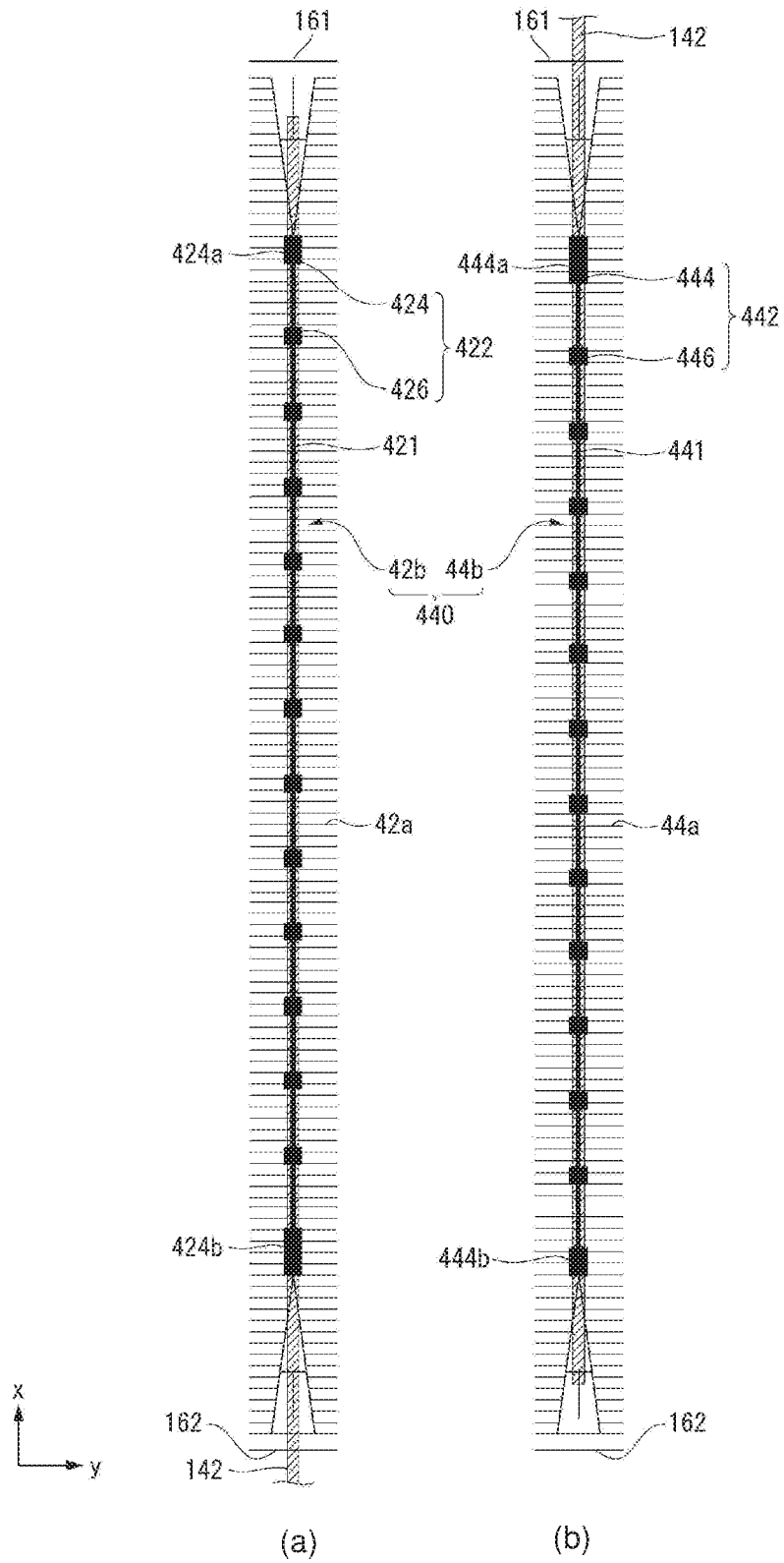
In FIG. 6, (a) is a partial front plan view illustrating a state in which a wiring member is attached to a portion "A" of FIG. 5, and (b) is a partial rear plan view illustrating a state in which a wiring member is attached to a portion "A" of FIG. 5.

In FIG. 6, (a) is a partial front plan view illustrating a state in which a wiring member is attached to a portion "A" of FIG. 5, and (b) is a partial rear plan view illustrating a state in which a wiring member is attached to a portion "A" of FIG. 5. FIG. 7 is a cross-sectional view schematically illustrating a state in which a wiring member is attached to a solar cell along line VII-VII of FIG. 5. FIG. 7 illustrates the semiconductor substrate 160, the pad portions 422 and 442, and the wiring member 142 for the simple and clear illustration.

Figure 7:
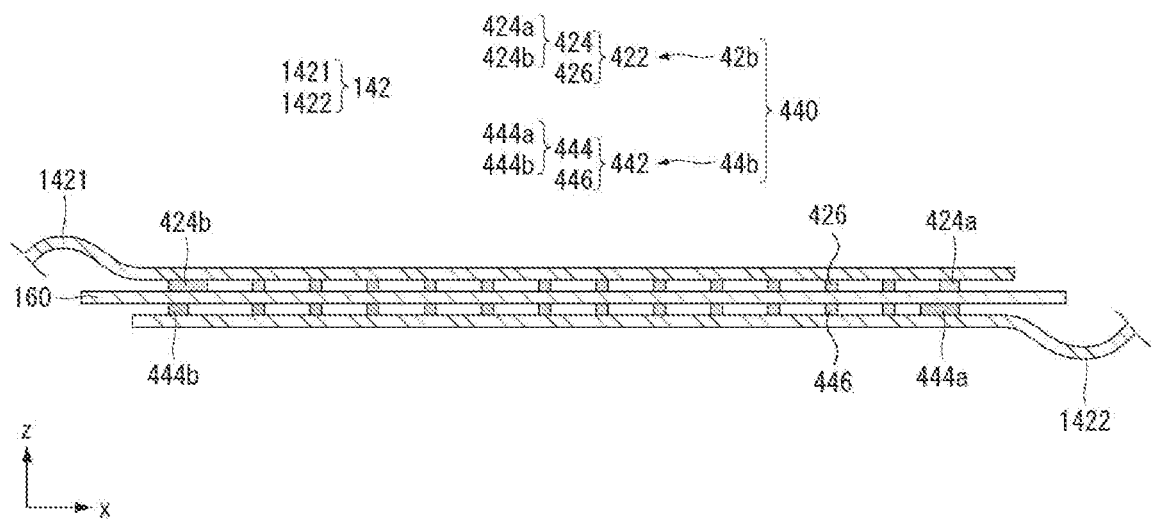
FIG. 7 is a cross-sectional view schematically illustrating a state in which a wiring member is attached to a solar cell along line VII-VII of FIG. 5.

Referring to FIGS. 5 to 7, the first outer pad 424 positioned at both ends (or opposite ends) of the first bus bar 42b of the first electrode 42 includes a first end pad (or a first one end pad) 424*a* positioned on one end side (e.g., the upper side in (a) of FIG. 6) of the first bus bar 42*b* and on which an end of the wiring member 142 (e.g., a wiring member 1421) is positioned, and a first extension pad (or a second other end pad) 424*b* positioned on other end side (e.g., the lower side in (a) of FIG. 6) of the first bus bar 42*b* and on which an extension of the wiring member 142 (e.g., the wiring member 1421) is positioned. In this instance, the end of the wiring member 142 can indicate a portion in which the wiring member 142 is not connected to other solar cell 150 and is positioned inside the solar cell 150, and the extension of the wiring member 142 can indicate a portion extended from one surface of a solar cell 150 to other surface of the solar cell 150 adjacent to the one surface so that the wiring member 142 is connected to the corresponding solar cell 150.

An area of the first end pad 424*a* is different from an area of the first extension pad 424*b*. More specifically, the area of the first extension pad 424*b* can be greater than the area of the first end pad 424*a*. In this instance, even if widths of the first end pad 424*a* and the first extension pad 424*b* determined in relation to a width or a diameter of the wiring member 142 are different from each other, it can have nothing to do with a contact area of the wiring member 142. Thus, the widths of the first end pad 424*a* and the first extension pad 424*b* in the first direction can be substantially equal to each other, and a length of the first extension pad 424*b* in the second direction can be greater than a length of the first end pad 424*a* in the second direction. In embodiments, the area of the first extension pad 424*b* can be different than the area of the first end pad 424*a* by way of having both different widths and lengths, or can be different by way of having one of the widths and lengths be the same but the other of the widths and lengths be different. In embodiments, "substantially equal (or the same)" can mean that it has an error or a size difference that is less than 5%, and "area or length is greater" can mean that it has a larger area or length of 5% or more (e.g., 10% or more or 20% or more).

The first outer pad 424 is a last portion positioned around both edges (or opposite edges) of the semiconductor substrate 160 and to which the wiring member 142 is substantially attached inside the solar cell 150. Hence, since whether the wiring member 142 is attached depends on an outer edge of the first outer pad 424, a heat stress can be greatly generated in the first outer pad 424 than the first inner pad 426. Comparing the first end pad 424*a,* on which the end of the wiring member 142 is positioned, with the first extension pad 424*b* on which the extension of the wiring member 142 is positioned, a portion that bends from one surface toward the other surface for the connection of the wiring member 142 and other solar cell 150 exists around the first extension pad 424*b*. Hence, a force is applied such that the wiring member 142 is away from the other solar cell 150. As a result, the problem caused by the heat stress in the first extension pad 424*b* can be larger than in the first end pad 424*a*.

Considering this, the area of the first extension pad 424*b* is greater than the area of the first end pad 424*a*. Then, an adhesive area of the wiring member 142 and the first extension pad 424*b* can be increased by relatively increasing the area of the first extension pad 424*b* positioned in a portion in which the adhesive properties of the wiring member 142 can be greatly reduced, thereby maintaining the excellent adhesive properties of the wiring member 142. Hence, embodiments can improve the reliability and the productivity of the solar cell panel 100 by reducing the defects of the solar cell panel 100. Further, an area of the first electrode 42 can decrease by relatively reducing the area of the first end pad 424*a* in which a reduction in the adhesive properties of the wiring member 142 is relatively small. By asymmetrically forming the first end pad 424*a* and the first extension pad 424*b* as described above, an amount of the electrode for forming the first electrode 42 can decrease. Further, by minimizing the light loss due to the first electrode 42 and the recombination that can occur at the first electrode 42, an open-circuit voltage and efficiency of the solar cell 150 can be improved, and an output of the solar cell panel 100 can also be improved.

Figure 8:
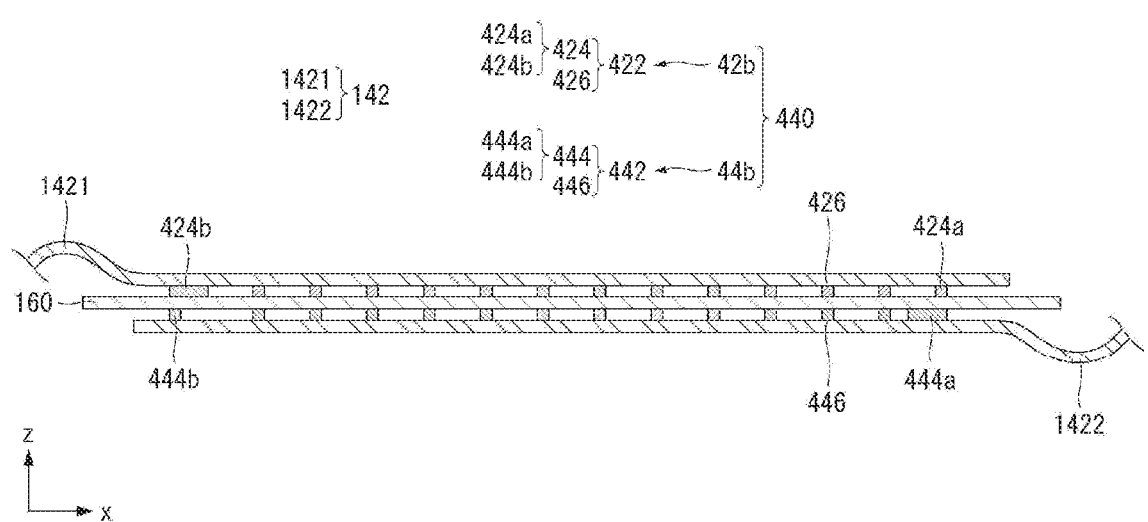
FIG. 8 is a cross-sectional view schematically illustrating a state in which a wiring member is attached to a solar cell in a solar cell panel according to a modified example of the invention.

The area (e.g., length) of the first extension pad 424*b* is greater than an area (e.g., length) of the first inner pad 426. The area (e.g., length) of the first end pad 424*a* can be greater than the area (e.g., length) of the first inner pad 426. Then, the area of each of the first end pad 424*a* and the first extension pad 424*b* is greater than the length of the first inner pad 426, and thus the adhesive properties of the wiring member 142 at the first outer pad 424 can be kept good or well maintained. However, embodiments are not limited thereto. As one modified example, as illustrated in FIG. 8, the area (e.g., length) of the first end pad 424*a* can be equal to the area (e.g., length) of the first inner pad 426. Alternatively, the area (e.g., length) of the first end pad 424*a* can be less than the area (e.g., length) of the first inner pad 426. Hence, the area of the first electrode 42 can be further reduced by reducing the area of the first end pad 424*a*.

Referring again to FIGS. 5 to 7, the second outer pad 444 positioned at both ends (or opposite ends) of the second bus bar 44*b* of the second electrode 44 includes a second extension pad (or a second one end pad) 444*a* positioned on one end side (e.g., the upper side in FIG. 6) of the second bus bar 44*b* and on which an extension of the wiring member 142 (e.g., a second wiring member 1422) is positioned, and a second end pad (or a second other end pad) 444*b* positioned on other end side (e.g., the lower side in FIG. 6) of the second bus bar 44*b* and on which an end of the wiring member 142 (e.g., the second wiring member 1422) is positioned. In (a) and (b) of FIG. 6, an upper edge 161 and a lower edge 162 of the solar cell 150 are shown.

An area of the second end pad 444*b* and an area of the second extension pad 444*a* are different from each other. More specifically, the area of the second extension pad 444*a* can be greater than the area of the second end pad 444*b*. In this instance, a width of the second extension pad 444*a* can be substantially equal to the width of the first end pad 424*a,* and a length of the second extension pad 444*a* in the second direction can be greater than a length of the second end pad 444*b* in the second direction. Hence, the adhesive properties of the wiring member 142 can be kept good by increasing an adhesive area of the wiring member 142 and the second extension pad 444*a* positioned in a portion where the adhesive properties of the wiring member 142 in the second electrode 44 can be greatly reduced. Further, embodiments of the invention can improve the reliability and the productivity of the solar cell panel 100 by reducing the defects of the solar cell panel 100. Further, an area of the second electrode 44 can decrease by relatively reducing the area of the second end pad 444*b* in which a reduction in the adhesive properties of the wiring member 142 is relatively small. By asymmetrically forming the second end pad 444*b* and the second extension pad 444*a* as described above, an amount of the electrode for forming the second electrode 44 can decrease. Further, by minimizing the light loss due to the second electrode 44 and the recombination that can occur at the second electrode 44, the open-circuit voltage and the efficiency of the solar cell 150 can be improved, and an output of the solar cell panel 100 can also be improved.

The area (e.g., length) of the second extension pad 444a is greater than an area (e.g., length) of a second inner pad 446. The area (e.g., length) of the second end pad 444b can be greater than the area (e.g., length) of the second inner pad 446. Then, the area of each of the second extension pad 444a and the second end pad 444b is greater than the length of the second inner pad 446, and thus the adhesive properties of the wiring member 142 at the second outer pad 444 can be kept good. However, embodiments are not limited thereto. As one modified example, as illustrated in FIG. 8, the area (e.g., length) of the second end pad 444b can be equal to the area (e.g., length) of the second inner pad 446, or the area (e.g., length) of the second end pad 444b can be less than the area (e.g., length) of the second inner pad 446. Hence, the area of the second electrode 44 can be further reduced by reducing the area of the second end pad 444b.

In the present embodiment, the wiring member 142 is extended from one end side of a front surface of one solar cell 150 to the other side of a back surface of a solar cell 150 adjacent to the one side, and the second wiring member 1422 is extended from the other end side of a back surface of the one solar cell 150 to one end side of a front surface of a solar cell 150 adjacent to the other side. Hence, when viewed from the first direction, an end of a wiring member 1421 is positioned on one end side of a front surface of each solar cell 150 in first and second bus bars 42b and 44b constituting a pair of bus bars 440 positioned at the same position, and an end of a second wiring member 1422 is positioned on the other side of a back surface of each solar cell 150. Hence, the second extension pad 444a is positioned on the same end side as the first end pad 424a and on a reverse surface of the solar cell 150, and the second end pad 444b is positioned on the same other end side as the first extension pad 424b and on the reverse surface of the solar cell 150.

In this instance, an end (i.e., an outer edge) of the first end pad 424a and an end (i.e., an outer edge) of the second extension pad 444a can be positioned at the same position in the second direction. And/or, an end of the second end pad 444b and an end of the first extension pad 424b can be positioned at the same position in the second direction. Then, a distance from the edge of the semiconductor substrate 160 to the first and second outer pads 424 and 444 is the same at both surfaces of the semiconductor substrate 160, and thus the solar cell 150 can be stably designed without a problem such as an undesired shunt.

Figure 9:
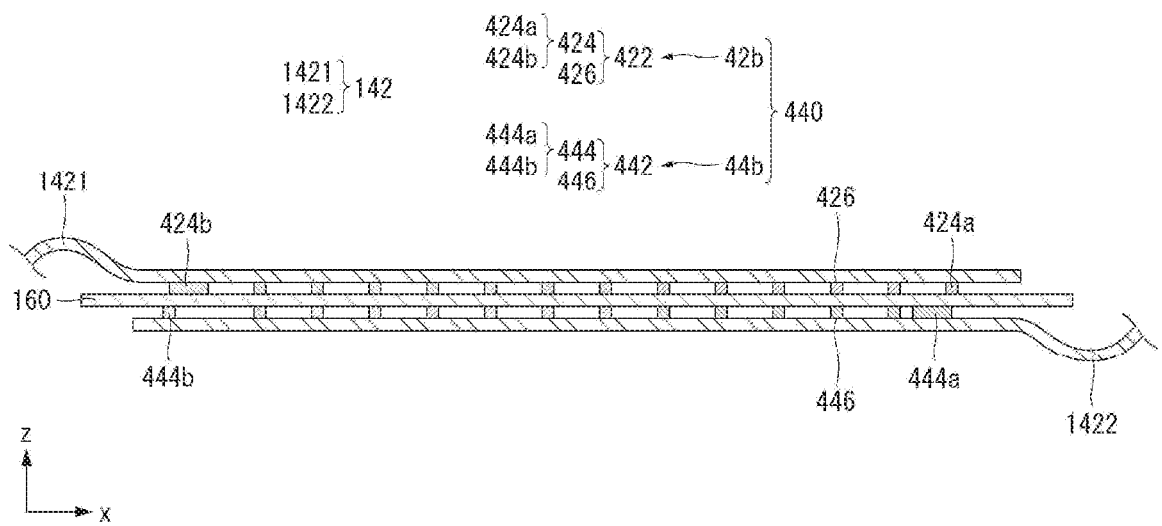
FIG. 9 is a cross-sectional view schematically illustrating a state in which a wiring member is attached to a solar cell in a solar cell panel according to another modified example of the invention.

However, embodiments are not limited thereto. As one modified example, as illustrated in FIG. 9, an end of the second extension pad 444a can be positioned more inside than an end of the first end pad 424a in the second direction. And/or, an end of the first extension pad 424b can be positioned more inside than an end of the second end pad 444b in the second direction. Then, a distance between the ends of the first and/or second extension pads 424b and 444a in which the adhesive properties of the wiring member 142 can be relatively reduced, and the edge of the semiconductor substrate 160 is greater than a distance between the ends of the first and/or second end pads 424a and 444b and the edge of the semiconductor substrate 160, and thus a force applied to the wiring member 142 attached to the first and/or second extension pads 424b and 444a can be further reduced. Hence, embodiments can efficiently prevent a reduction in the adhesive properties at the first and/or second extension pads 424b and 444a in which the adhesive properties of the wiring member 142 can be relatively reduced.

Figure 10:
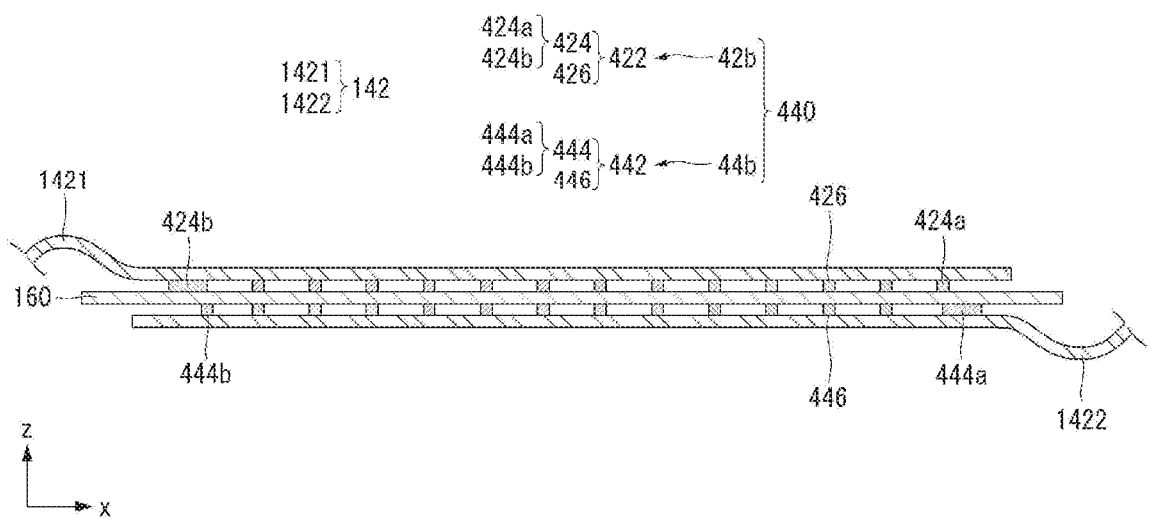
FIG. 10 is a cross-sectional view schematically illustrating a state in which a wiring member is attached to a solar cell in a solar cell panel according to another modified example of the invention.

As another modified example, as illustrated in FIG. 10, an end of the second extension pad 444a can be positioned more outside than an end of the first end pad 424a in the second direction. And/or, an end of the first extension pad 424b can be positioned more outside than an end of the second end pad 444b in the second direction. Hence, carriers can be efficiently collected at the edge of the semiconductor substrate 160 by relatively reducing a distance between the ends of the first and/or second end pads 424a and 444b and the edge of the semiconductor substrate 160 in a portion where the wiring member 142 is not extended and an end is positioned.

Figure 11:
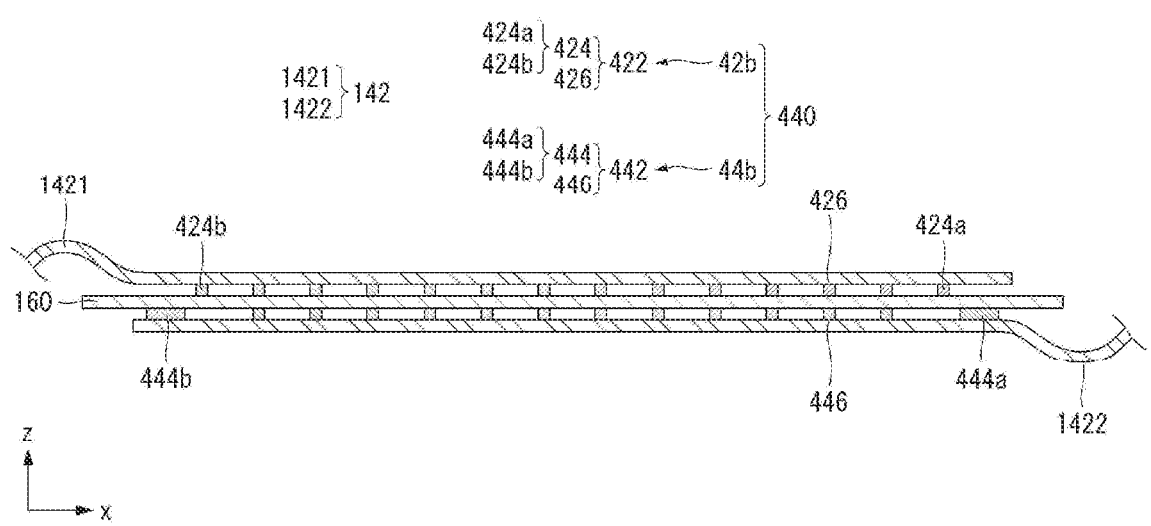
FIG. 11 is a cross-sectional view schematically illustrating a state in which a wiring member is attached to a solar cell in a solar cell panel according to another modified example of the invention.

FIGS. 9 and 10 illustrate that at least a portion of the first end pad 424a and a portion of the second extension pad 444a overlap each other in the second direction, and at least a portion of the first extension pad 424b and a portion of the second end pad 444b overlap each other in the second direction, by way of example. Then, since a difference between the first and second bus bars 42b and 44b is not large, the stability of the structure can be improved. However, embodiments are not limited thereto. As illustrated in FIG. 11, the first end pad 424a and the second extension pad 444a can be positioned riot to overlap each other in the second direction, and/or the first extension pad 424b and the second end pad 444b can be positioned not to overlap each other in the second direction. Hence, since the first and second outer pads 424 and 444, that are a portion to which the wiring member 142 is finally attached, do not overlap each other, a heat stress can be prevented from be concentrated on a narrow portion.

The above embodiments described that the first end pad 424a and the first extension pad 424b are positioned asymmetrically with each other, the second end pad 444b and the second extension pad 444a are positioned asymmetrically with each other, and a relationship between the first end pad 424a and the second extension pad 444a positioned on the same end side is substantially the same as a relationship between the second end pad 444b and the first end pad 424a positioned on the same other end side, by way of example. That is, a relationship between the first end pad 424a and the first extension pad 424b and a relationship between the second end pad 444b and the second extension pad 444a are substantially the same as each other and can be reversed to each other in the formation position. Hence, the stability of the above-described structure can be improved. However, embodiments are not limited thereto. Thus, the above-described structure can be applied to the first end pad 424a and the first extension pad 424b and need not be applied to the second end pad 444b and the second extension pad 444a. On the contrary, the above-described structure can be applied to the second end pad 444b and the second extension pad 444a and need not be applied to the first end pad 424a and the first extension pad 424b. Further, a relationship between the first end pad 424a and the first extension pad 424b can be different from a relationship between the second end pad 444b and the second extension pad 444a. For example, a relationship between the first end pad 424a and the first extension pad 424b or a relationship between the first end pad 424a and the second extension pad 444a can have one of examples illustrated in FIGS. 7 to 11, and a relationship between the second end pad 444b and the second extension pad 444a or a relationship between the second end pad 444b and the first end pad 424a can have one of examples illustrated in FIGS. 7 to 11. Also, as provided by the examples illustrated in FIGS. 7 to 11, the first extension pad 424b and the second extension pad 444a can be larger sized than the first end pad 424a and the second end pad 444b, and can be both connected to the respective first wiring member 1421 and second wiring member 1422 (FIGS. 7-10), or one or the other can be connected to the respective first wiring member 1421 and second wiring member 1422 (FIG. 11).

The above embodiments described that the edge area PA is included, but need not include the edge area PA. This is described in detail later with reference to FIGS. 12 to 15.

A solar cell according to another embodiment of the invention and a solar cell panel including the same are described in detail below. Detailed descriptions will be omitted for the same or extremely similar parts as those described above, and different parts will be described in detail. It is also within the scope of the invention to combine the above-described embodiments or variations thereof with the embodiments described below or modifications thereof.

Figure 12:
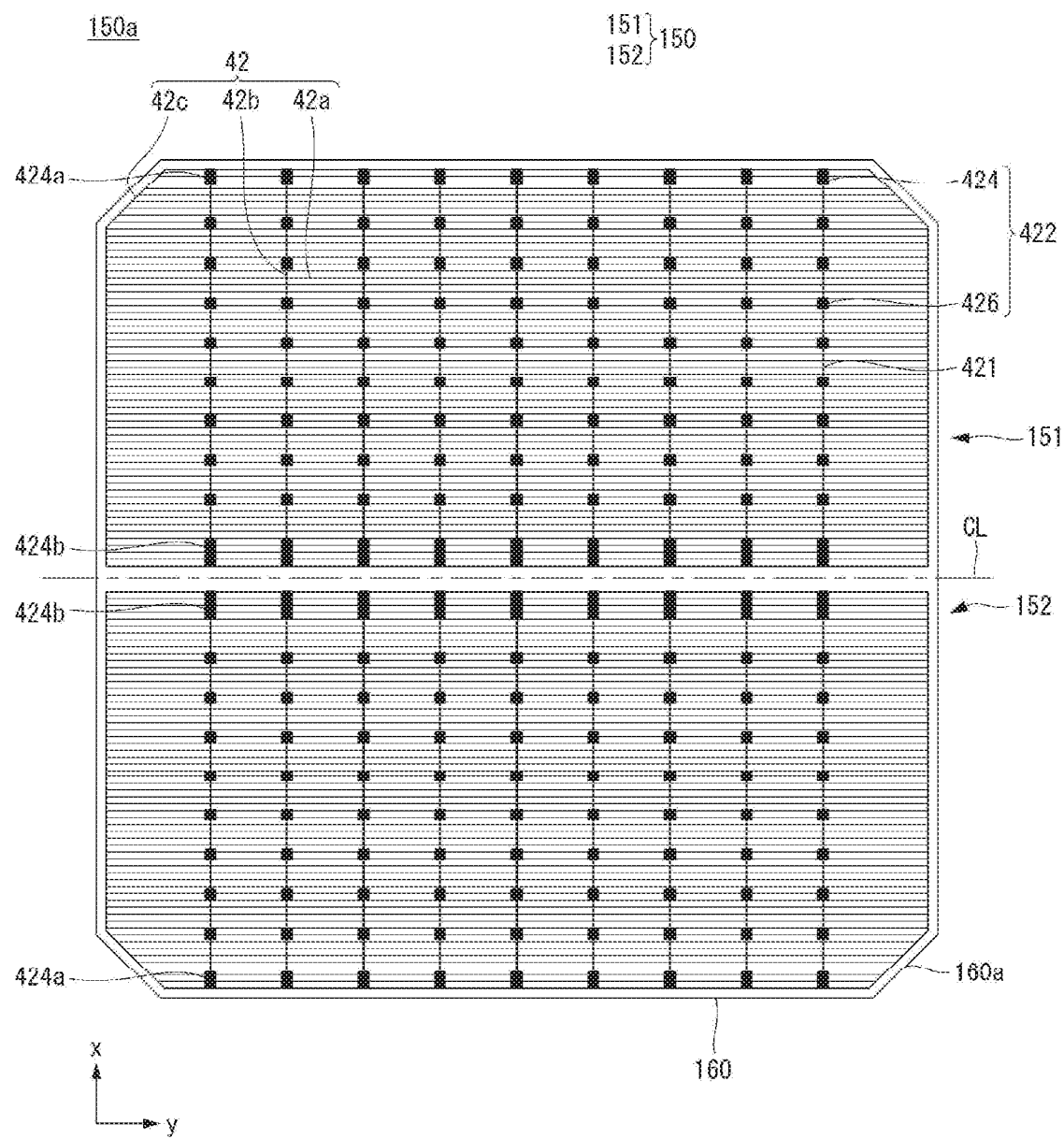
FIG. 12 is a front plan view schematically illustrating a mother solar cell including a plurality of solar cells that is applicable to a solar cell panel according to another embodiment of the invention.
Figure 13:
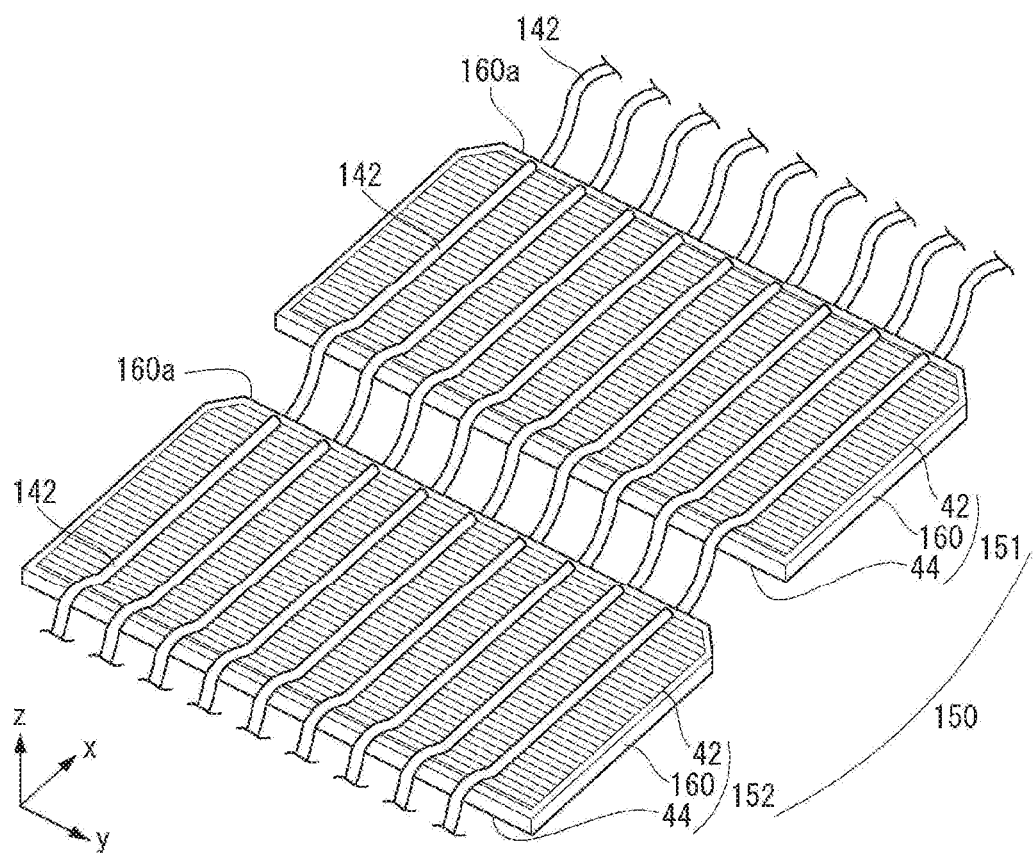
FIG. 13 is a perspective view schematically illustrating first and second solar cells that are included in a solar cell panel according to another embodiment of the invention and are connected by a wiring member.

FIG. 12 is a front plan view schematically illustrating a mother solar cell including a plurality of solar cells that is applicable to a solar cell panel according to another embodiment of the invention. FIG. 13 is a perspective view schematically illustrating first and second solar cells that are included in a solar cell panel according to another embodiment of the invention and are connected by a wiring member. FIGS. 12 and 13 mainly illustrate a semiconductor substrate 160 and a first electrode 42 for the simple and clear illustration.

Referring to FIGS. 12 and 13, one mother solar cell 150a is cut along a cutting line CL to manufacture first and second solar cells 151 and 152 that are a plurality of unit solar cells. Each of the first and second solar cells 151 and 152 that are a unit solar cell serves as one solar cell 150. If the mother solar cell 150a is divided into two solar cells 150 as described above, the present embodiment can reduce a cell to module loss (CTM loss) generated when a solar cell panel is manufactured by connecting the plurality of solar cells. That is, if a current generated by the solar cell itself is reduced by reducing an area of the solar cell, a CTM loss of a solar cell panel 100 can be reduced by reducing a current reflected as a square value even if the number of solar cells 150, that are reflected as is, is increased.

The present embodiment can reduce the area of the solar cell 150 by manufacturing the mother solar cell 150a according to a related art manufacturing method and then cutting the mother solar cell 150a. That is, the present embodiment can manufacture the mother solar cell 150a and then cut the mother solar cell 150a by using an equipment that has been used in the related art, an optimized design according to the equipment, etc. Hence, the present embodiment can minimize a burden on the equipment and the process cost. On the other hand, if a mother solar cell with the reduced size is manufactured, there is a burden of replacing the equipment used or changing a setting, or the like.

In general, a semiconductor substrate 160 of the mother solar cell 150a is manufactured using a roughly circular ingot, and lengths of sides of the semiconductor substrate 160 are the same or almost similar in two axes (e.g., an axis parallel to a finger line 42a and an axis parallel to a bus bar 42b) orthogonal to each other as in a circle, a square, or similar shapes. For example, the semiconductor substrate 160 of the mother solar cell 150a according to the present embodiment can have an octagonal shape having an inclined side 160a at each of four edge portions in an almost square shape. If such a shape is used, the semiconductor substrate 160 having a maximum area from the same ingot can be obtained. Hence, the mother solar cell 150a has a symmetrical shape, and a maximum horizontal axis and a maximum vertical axis have the same distance, arid a minimum horizontal axis and a minimum vertical axis have the same distance.

In the present embodiment, since the mother solar cell 150a is cut along the cutting line CL to manufacture the solar cell 150, the semiconductor substrate 160 of the solar cell 150 has a shape having a long axis and a short axis. The cutting line CL can continue to be parallel to a first direction (e.g., y-axis direction in the drawings) that is a longitudinal direction of first and second conductive regions 20 and 30 and finger lines 42a and 44a and to intersect a second direction (e.g., x-axis direction in the drawings) that is an extending direction of bus bars 42b and 44b, and the plurality of solar cells 150 positioned inside the mother solar cell 150a can be extended along the first direction Hence, in each solar cell 150, a first electrode 42 positioned at a front surface of the semiconductor substrate 160 includes a plurality of first finger lines 42a that is extended in the first direction parallel to the long axis and is positioned parallel to each other, and a first bus bar 42b formed in the second direction parallel to the short axis. The first bus bar 42b can include a plurality of first pad portions 424 positioned to be spaced apart from each other in the second direction parallel to the short axis, and the first pad portion 424 can include a first outer pad 424 including a first end pad 424a and a first extension pad 424b, and a first inner pad 426 between the first end pad 424a and the first extension pad 424b. Similar to the first electrode 42, a second electrode 44 includes a plurality of second finger lines that is extended in the first direction parallel to the long axis and is positioned parallel to each other, and a second bus bar formed in the second direction parallel to the short axis. The second bus bar can include a plurality of second pad portions, and the second pad portion can include a second outer pad including a second end pad and a second extension pad, and a second inner pad between the second end pad and the second extension pad. The descriptions of shape, position, etc. of the first finger line 42a and the first bus bar 42b can be applied to the second finger line and the second bus bar, except that the first end pad 424a and the second end pad are positioned in reverse to each other in the second direction, and the first extension pad 424b and the second extension pad are positioned in reverse to each other in the second direction.

Hence, the long axis of the solace cell 150 is positioned parallel to the first direction, the short axis of the solace cell 150 is positioned parallel to the second direction, and a wiring member 142 connects the first and second solar cells 151 and 152 that are adjacent to in a direction of the short axis.

FIG. 13 illustrates that one mother solar cell 150a is cut into two parts, and then the inclined sides 160a are positioned in the same direction such that the cutting line CL does not meet each other, by way of example. Hence, if cutting surfaces by the cutting line CL are disposed not to face each other, a risk of electrical short, etc. can be further reduced than when the cutting surfaces face each other.

Considering this arrangement, positions of the first end pad 424a and the first extension pad 424b are determined in the first and second solar cells 150 positioned at the mother solar cell 150. The present embodiment described that the first end pad 424a is positioned at the inclined side 160a and the first extension pad 424b is positioned in a portion adjacent to the cutting line CL, and thus an end of the wiring member 142 is positioned at the inclined side 160a at the front surface of the solar cell 150 and is extended to another solar cell 150 in the portion adjacent to the cutting line CL, by way of example. In this instance, the second end pad can be positioned in a portion adjacent to the cutting line CL at the back surface of the solar cell 150, and the second extension pad can be positioned at the inclined side 160a, and thus an end of the wiring member 142 can be positioned in the portion adjacent to the cutting line CL and can be extended to another solar cell 150 at the inclined side 160a.

Figure 14:
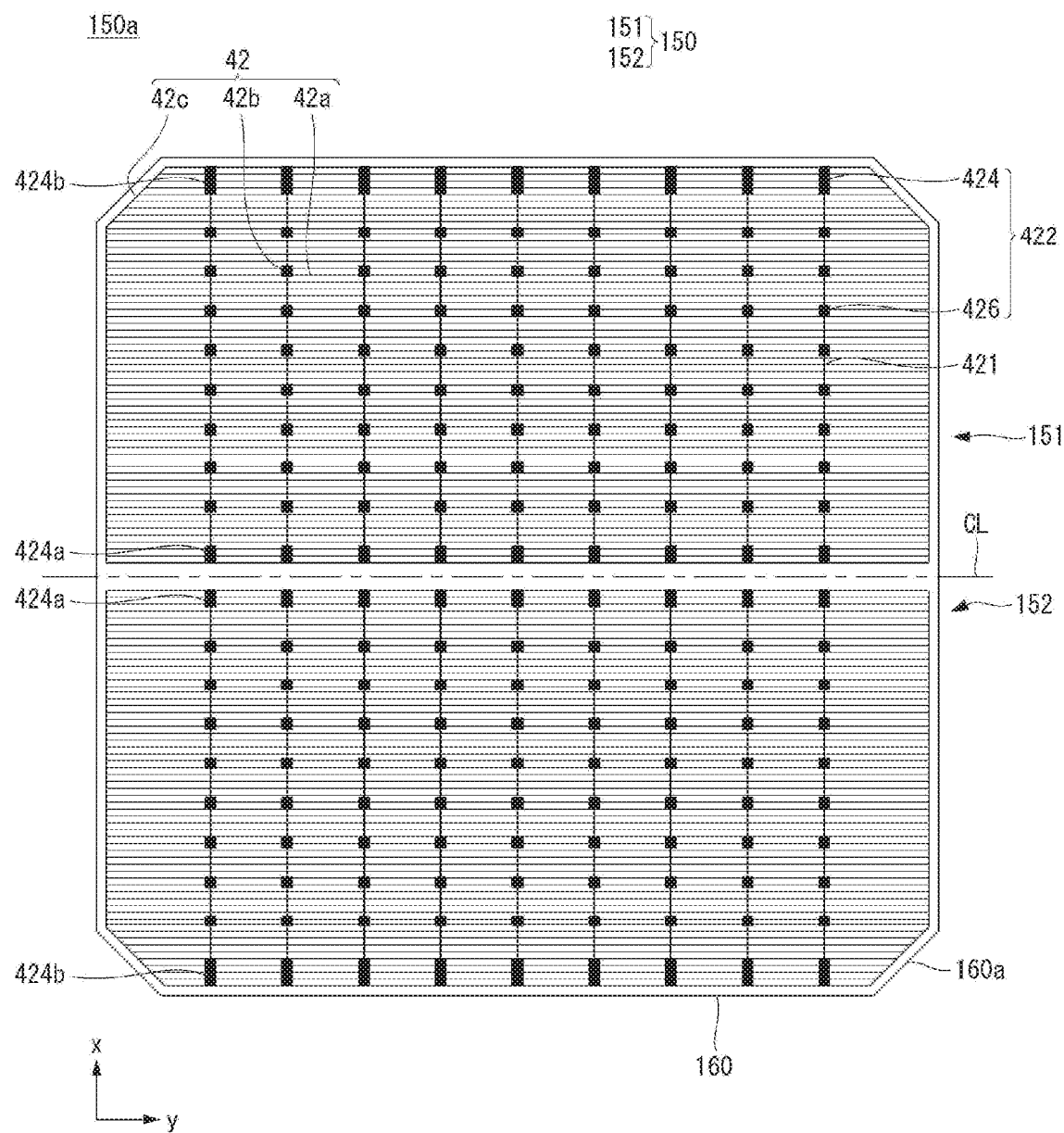
FIG. 14 is a front plan view schematically illustrating a mother solar cell including a plurality of solar cells that is applicable to a solar cell panel according to another embodiment of the invention.

On the contrary, as illustrated in FIG. 14, the first extension pad 424b can be positioned at the inclined side 160a, and the first end pad 424a can be positioned in a portion adjacent to the cutting line CL. Then, an end of the wiring member 142 can be positioned in a portion adjacent to the cutting line CL at the front surface of the solar cell 150 and can be extended to another solar cell 150 at the inclined side 160a. In this instance, the second end pad can be positioned at the inclined side 160a at the back surface of the solar cell 150, and the second extension pad can be positioned in a portion adjacent to the cutting line CL, and thus an end of the wiring member 142 can be positioned at the inclined side 160a and can be extended to another solar cell 150 in the portion adjacent to the cutting line CL.

The present embodiment described that an end of the outer pad 424 is positioned on the same line as an outermost finger line of the plurality of finger lines 42a since a separate edge area PA is not included, by way of example. If the wiring member is extended in a direction parallel to the short axis, the length of the wiring member 142 attached to each solar cell 150 is shortened, and a force applied to the wiring member 142 can be somewhat reduced undesirably. However, embodiments are not limited thereto. For example, as illustrated in FIG. 5, the edge area PA can be included at one end or both ends (or opposite ends).

The embodiment illustrated and described that one mother solar cell 150a is cut along one cutting line CL to form the two solar cells 150, by way of example. However, embodiments are not limited thereto. For example, one mother solar cell 150a can be cut along two or more cutting lines CL to form the three or more solar cells 150.

The embodiment illustrated and described that the first electrode 42 and/or the second electrode 44 are not formed around the cutting line CL, and the first electrode 42 and/or the second electrode 44 corresponding to each solar cell 150 are spaced apart from each other with the cutting line CL interposed between them, by way of example. However, embodiments are not limited thereto. For example, the first electrodes 42 and/or the second electrodes 44 corresponding to the plurality of solar cells 150 of the mother solar cell 150a can be connected and separated from each other by the cutting line CL. For example, if the mother solar cell 150a, in which two outer pads positioned on both sides of the first bus bar 42b and/or the second bus bar have the same area (e.g., the same length), is formed and then is cut along the cutting line CL parallel to the first direction, one outer pad positioned at each solar cell 150 can be used as an extension pad, and an inner pad positioned adjacent to the cutting line CL can be used as an end pad. Alternatively, if one extension pad is cut to form two outer pads while forming the mother solar cell 150a including one extension pad extended from the first bus bar 42b and/or the second bus bar to a portion adjacent to the cutting line CL and then cutting the mother solar cell 150a along the cutting line CL parallel to the first direction, one outer pad positioned at each solar cell 150 can be used as an extension pad, and a pad positioned opposite the outer pad can be used as an end pad. In this instance, a length of the extension pad can be larger than two times a length of the inner pad. Alternatively, if the mother solar cell 150a, in which two outer pads having a longer length than an inner pad are formed in a portion adjacent to the cutting line CL at the first bus bar 42b and/or the second bus bar, is formed and then the two outer pads are cut along the cutting line CL parallel to the first direction, one outer pad positioned at each solar cell 150 can be used as an extension pad, and a pad positioned opposite the outer pad can be used as an end pad. Various other variations can be used.

Figure 15:
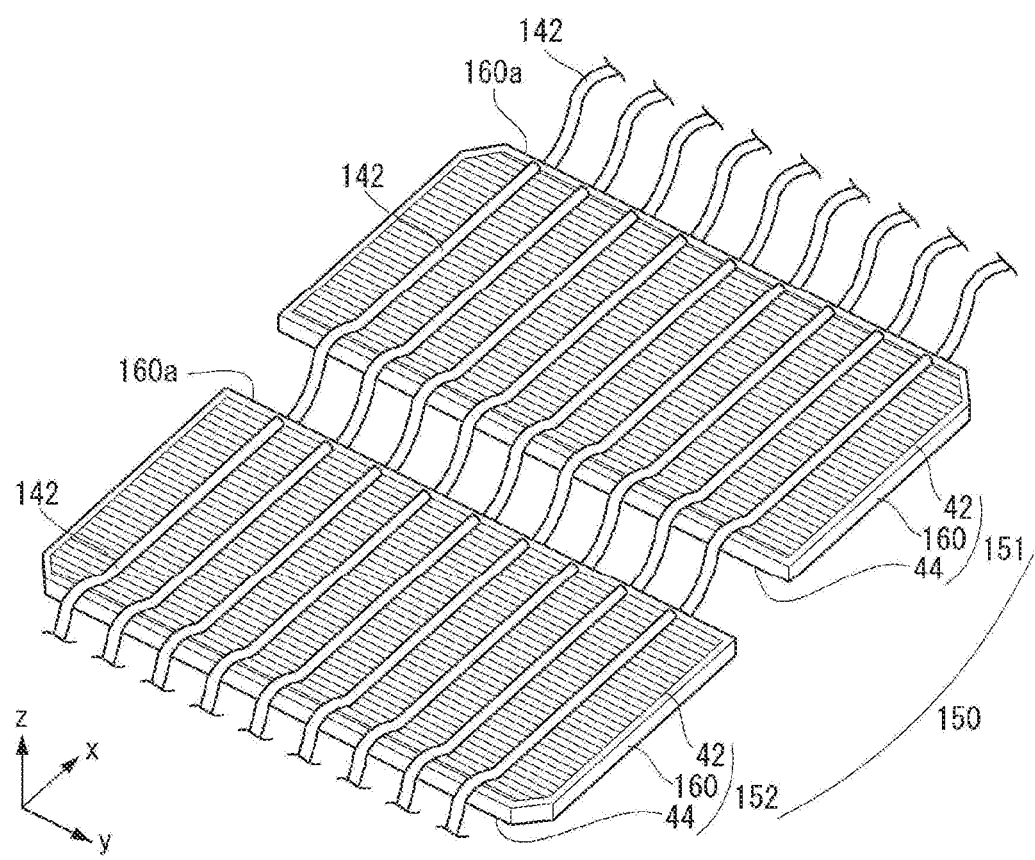
FIG. 15 is a perspective view schematically illustrating first and second solar cells that are included in a solar cell panel according to another embodiment of the invention and are connected by a wiring member.

In the plurality of solar cells 151 and 152 positioned at the mother solar cell 150a, the first end pad 424a and the first extension pad 424b can be positioned repeatedly. That is, in the plurality of solar cells 151 and 152, each first end pad 424a can be positioned on one side (e.g., the upper side or the lower side in the drawing), and the first extension pad 424b can be positioned on the other side (e.g., the lower side or the upper side in the drawing). Hence, in the plurality of solar cells 151 and 152, each second extension pad 444a can be positioned on one side (e.g., the upper side or the lower side in the drawing), and the second end pad 444b can be positioned on the other side (e.g., the lower side or the upper side in the drawing). Then, as illustrated in FIG. 15, the wiring members 142 can be connected in order in a state where the plurality of solar cells 151 and 152 manufactured from the mother solar cell 150a are positioned as is, thereby connecting the plurality of solar cells 151 and 152. Then, the wiring members 142 can be connected while the shape of the mother solar cell 150a is maintained as is, i.e., so that the inclined sides 160a positioned at the mother solar cell 150a are positioned outside correspondingly to the mother solar cell 150a. Various other variations can be used.

The above-described structure of the first and second electrodes 42 and 44 can be applied to each of the plurality of solar cells 150, and can be applied to one or some of the plurality of solar cells 150. The embodiments and the modified examples described with reference to FIGS. 1 to 11 can be applied to embodiments and modified examples described with reference to FIGS. 12 to 15.

The above embodiments described that one first extension pad 424b is included, and one first end pad 424a is included. That is, the above embodiments described that the number of first extension pads 424b is the same as the number of first end pads 424a, an area or a length (length between both ends or opposite ends) of the first extension pad 424b is the same as an area or a length of the first end pad 424a, and an overlap area (attaching area) or an overlap length (attaching length) between the wiring members 142 and the first extension pad 424b is the same as an overlap area (attaching area) or an overlap length (attaching length) between the wiring members 142 and the first end pad 424a.

However, embodiments are not limited thereto. Hence, at least one of the first end pad 424a and the first extension pad 424b can include a plurality of sub-pads 4242a and 4242b. This is described in detail below with reference to FIGS. 16 to 22. The following description will focus on the first end pad 424a and the first extension pad 424b of the first electrode 42, by way of example. However, the following structure can be applied to the second extension pad 444a and the second end pad 444b of the second electrode 44. That is, the following structure can be applied to at least one of the end pads 424a and 444b and the extension pads 424b and 444a of the first and second electrodes 42 and 44. It is also within the scope of the invention to combine the above-described embodiments or variations thereof with the embodiments described below or modifications thereof.

More specifically, the first end pad 424a and the first extension pad 424b can be different from each other. That is, the first end pad 424a and the first extension pad 424b can be different from each other in at least one of the number of pads, an outer area of the pad, a total length of the pad, a sum of total overlapping areas of the pad and the wiring member 142. (a sum of total attachment areas) (a sum of total formation areas of the first end pad 424a or the first extension pad 424b), a sum of total overlapping lengths of the pad and the wiring member 142 (a sum of total attachment lengths) (a sum of total formation lengths of the first end pad 424a or the first extension pad 424b).

In embodiments, the number of pads can mean the number of single components if the first end pad 424a or the first extension pad 424b is included as a single component, and can mean the number of sub-pads 4242a or 4242b if one pad is used, and the first end pad 424a or the first extension pad 424b includes a plurality of sub-pads 4242a or 4242b. The outer area of the pad can mean an area of a single component if the first end pad 424a or the first extension pad 424b is included as a single component, and can mean an area of a portion entirely connecting two outermost sub-pads 4242 if the first end pad 424a or the first extension pad 424b includes a plurality of sub-pads 4242a or 4242b. The total length of the pad can mean a distance between both ends (or opposite ends) of a single component in the second direction if the first end pad 424a or the first extension pad 424b is included as a single component, and can mean a distance between both ends (or opposite ends) of two outermost sub-pads 4242a and 4242b in the second direction if the first end pad 424a or the first extension pad 424b includes a plurality of sub-pads 4242a or 4242b. The sum of the total overlapping areas (the sum of the total attachment areas) can mean an overlapping area or an attachment area of the pad and the wiring member 142 in a single component if the first end pad 424a or the first extension pad 424b is included as a single component, and can mean a sum of overlapping areas or attachment areas of the pad and the wiring member 142 in each of a plurality of sub-pads 4242a or 4242b constituting the first end pad 424a or the first extension pad 424b if the first end pad 424a or the first extension pad 424b includes a plurality of sub-pads 4242a or 4242b. The sum of the total overlapping lengths (the sum of the total attachment lengths) can mean a distance between both ends (or opposite ends) of a single component in the second direction if the first end pad 424a or the first extension pad 424b is included as a single component, and can mean a sum of overlapping lengths or attachment lengths of the pad and the wiring member 142 in each of a plurality of sub-pads 4242a or 4242b if the first end pad 424a or the first extension pad 424b includes a plurality of sub-pads 4242a or 4242b. The sum of the total formation areas can mean an area of a single component if the first end pad 424a or the first extension pad 424b is included as a single component, and can mean a sum of areas of a plurality of sub-pads 4242a or 4242b constituting the first end pad 424a or the first extension pad 424b if the first end pad 424a or the first extension pad 424b includes a plurality of sub-pads 4242a or 4242b. The sum of the total formation lengths can mean a distance between both ends (or opposite ends) of a single component in the second direction if the first end pad 424a or the first extension pad 424b is included as a single component, and can mean a sum of lengths of each of the plurality of sub-pads 4242a or 4242b if the first end pad 424a or the first extension pad 424b includes a plurality of sub-pads 4242a or 4242b. Each embodiment is described based on this with reference to FIGS. 16 to 22.

Figure 16:
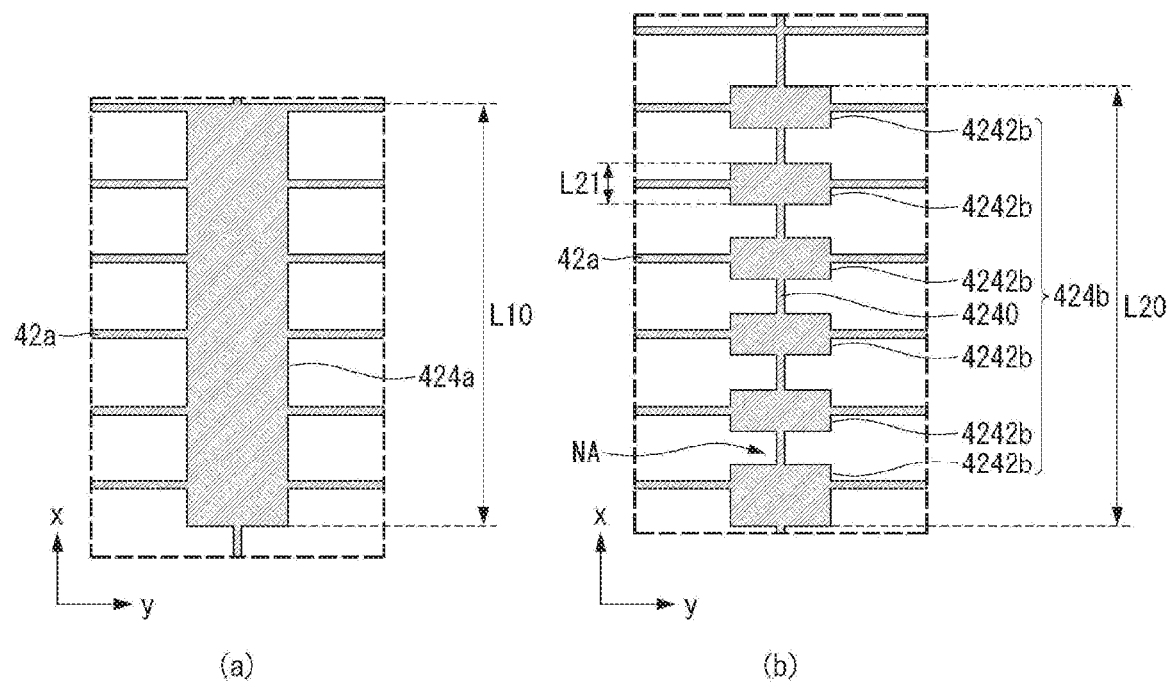
FIG. 16 is a partial plan view illustrating a part of a solar cell that can be included in a solar cell panel according to another embodiment of the invention.
Figure 17:
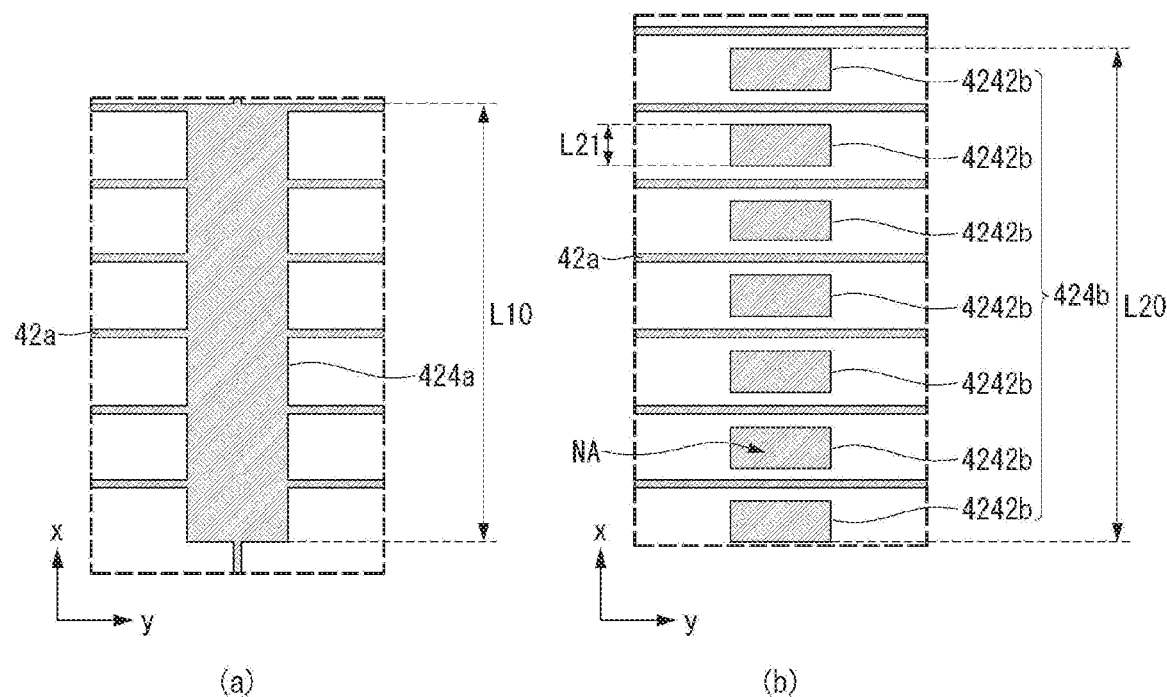
FIG. 17 is a partial plan view illustrating a part of a solar cell that can be included in a solar cell panel according to another embodiment of the invention.

FIG. 16 is a partial plan view illustrating a part of a solar cell according to another embodiment of the invention. More specifically, in FIG. 16, (a) illustrates an enlarged view of a portion including a first end pad 424a, and (b) illustrates an enlarged view of a portion including a first extension pad 424b.

Referring to (a) and (b) of FIG. 16, a first end pad 424a can be formed as a single component having a length L10 longer than a length of a first inner pad 426 (see FIG. 5) in the second direction (the x-axis direction in the drawing).

Also, for example, first extension pad 424b can include second sub-pads 4242b that are spaced apart from each other with a non-formation portion NA of a distance or a length smaller than an average distance of a plurality of inner pads 426 in the second direction. In this instance, a distance between the second sub-pads 4242b or a length of the non-formation portion NA in the second direction can be less than three times a pitch of a first finger line 42a. In particular, the distance between the second sub-pads 4242b or the length of the non-formation portion NA can be less than one time the pitch of the first finger line 42a. That is, the distance between the second sub-pads 4242b or the length of the non-formation portion NA can be equal to or less than the pitch of the first finger line 42a. This is to maintain the excellent adhesive properties with a wiring member 142 at the first extension pad 424b by reducing the distance between the second sub-pads 4242b or the length of the non-formation portion NA while forming the second sub-pads 4242b constituting the first extension pad 424b with a sufficient length.

In this instance, as illustrated in (b) of FIG. 16, the second sub-pad 4242b can be disposed at a position connected to the first finger line 42a. In this instance, the second sub-pads pads 4242b can be positioned respectively corresponding to the first finger lines 42a, and thus the adhesive properties with the wiring member 142 can be improved. As a modified example, as shown in (b) of FIG. 17, at least one of the second sub-pads 4242b can be positioned between the first finger lines 42a without overlapping or being connected to the first finger line 42a. In this instance, one second sub-pad 4242b is positioned between every two first finger lines 42a, and thus the adhesive properties with the wiring member 142 can be improved. However, embodiments are not limited thereto, and the second sub-pads 4242b can have other arrangements.

Referring again to (b) of FIG. 16, the first extension pad 424b can further include a connection portion 4240 connecting the plurality of second sub-pads 4242b in the second direction. FIG. 16 illustrates that the connection portion 4240 constitutes a part of a first line portion 421 or is a portion extended parallel to the first line portion 421. However, embodiments are not limited thereto. For example, the connection portion 4240 can be positioned to connect a different position (e.g., one side or both edges (or opposite edges) of the second sub-pads 4242b in the first direction) from the first line portion 421 in the first direction (e.g., the y-axis direction in the drawing). As another example, as illustrated in (a) and (b) of FIG. 17, the connection portion 4240 is not included, and the plurality of second sub-pads 4242b can be positioned to be spaced apart from each other. Even in this case, the second sub-pads 4242b can be electrically connected through the wiring member 142. Various other variations can be used.

At least some of the second sub-pads 4242b can have a size equal to car greater than the inner pad 426. More specifically, when viewed from the second direction, a length L21 of at least some of the second sub-pads 4242b can be equal to or greater than a length of the inner pad 426. Hence, the adhesive properties with the wiring member 142 can be improved by the second sub-pads 4242b having the relatively large size. Alternatively, when viewed from the second direction, at least some of the second sub-pads 4242*b* can have a size less than the inner pad 426. More specifically, a length L21 of at least some of the second sub-pads 4242*b* can be less than a length of the inner pad 426. Hence, the adhesive properties with the wiring member 142 can be kept good by the second sub-pads 4242*b* while minimizing the area of the first extension pad 424*b* by the second sub-pads 4242*b* having the relatively small size.

As illustrated in (13) of FIG. 16, an outermost second sub-pad 4242h of the plurality of second sub-pads 4242*b* can have a maximum size. However, embodiments are not limited thereto, and various other variations can be used. For example, an outermost second sub-pad 4242*b* of the plurality of second sub-pads 4242*b* can have a minimum size. As another example, as illustrated in (b) of FIG. 17, the plurality of second sub-pads 4242*b* can have the same size. As another example, a plurality of second sub-pads 4242*b* having different sizes can be included and can have various arrangements.

The size of the inner pad 426 and the size of the second sub-pad 4242*b* can be different from each other by their lengths in the second direction. That is, since widths of the inner pad 426 and the second sub-pad 4242*b* are substantially the same (e.g., an error equal to or less than 10%) in order to stably attach the wiring member 142 and reduce the area of the first electrode 42, the size of the inner pad 426 and the size of the second sub-pad 4242*b* are adjusted by the length difference.

As described above, in the present embodiment, the number of first extension pads 424*b* is more than the number of first end pads 424*a*. A total length L20 (i.e., a distance in the second direction between both ends (or opposite ends) of two sub-pads 424 positioned on the outermost side among a plurality of sub-pads 424 constituting the first extension pad 424*b*) of the first extension pad 424*b* can be greater than a total length L10 (i.e., a distance between both ends (or opposite ends) of the first end pad 424*a* in the second direction) of the first end pad 424*a*. In this instance, a sum (i.e., a sum of lengths L21 of the plurality of sub-pads 424) of total overlapping areas or total overlapping lengths of the wiring member 142 and the first extension pad 424*b* can be less than a sum (i.e., the length L10 of the first end pad 424*a*) of total overlapping areas or total overlapping lengths of the wiring member 142 and the first end pad 424*a*. That is, a sum of total formation areas or total formation lengths of the first extension pad 424*b* can be less than a sum of total formation areas or total formation lengths of the first end pad 424*a*. Hence, an adhesion of the first extension pad 424*b* can be increased further than that of the first end pad 424*a* by increasing the total length L20 of the first extension pad 424*b* while reducing the cost and reducing a shading loss by reducing the total formation area of the first extension pad 424*b*.

However, embodiments are not limited thereto. For example, a sum of total overlapping areas or total overlapping lengths of the wiring member 142 and the first extension pad 424*b* can be equal to or greater than a sum (i.e., the length L10 of the first end pad 424*a*) of total overlapping areas or total overlapping lengths of the wiring member 142 and the first end pad 424*a*. That is, a sum of total formation areas or total formation lengths of the first extension pad 424*b* can be greater than a sum of total formation areas or total formation lengths of the first end pad 424*a*. Hence, since all of the total overlapping areas or the total overlapping lengths and the total length L20 of the first extension pad 424*b* can be equal to or greater than that of the first end pad 424*a*, the adhesion at the first extension pad 424*b* can be further improved.

Figure 18:
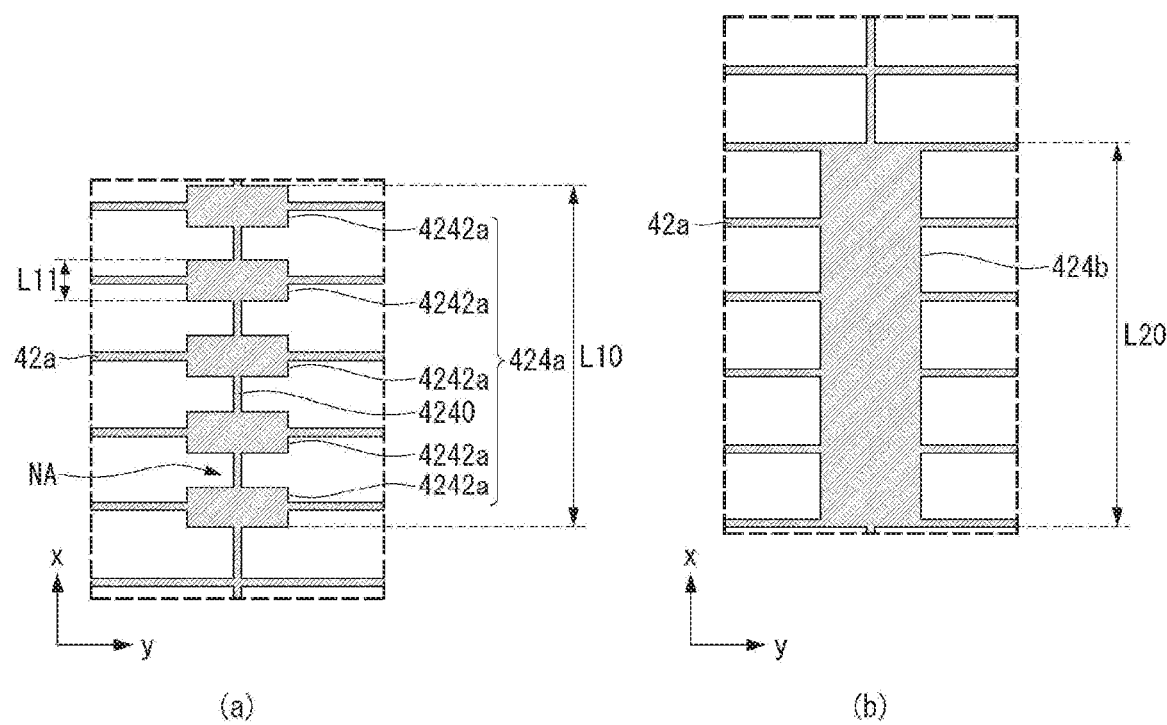
FIG. 18 is a partial plan view illustrating a part of a solar cell that can be included in a solar cell panel according to another embodiment of the invention.

FIG. 18 is a partial plan view illustrating a part of a solar cell according to another embodiment of the invention. More specifically, in FIG. 18, (a) illustrates an enlarged view of a portion including a first end pad 424*a*, and (b) illustrates an enlarged view of a portion including a first extension pad 424*b*.

Referring to (b) of FIG. 18, a first extension pad 424*b* can be formed as a single component having a length L20 longer than a length of a first inner pad 426 in the second direction (the x-axis direction in the drawing).

Also, in (a) of FIG. 18, a first end pad 424*a* can include first sub-pads 4242*a* that are spaced apart from each other with a non-formation portion NA of a distance or a length smaller than an average distance of a plurality of inner pads 426 in the second direction. The description of the second sub-pads 4242*b* with reference to FIGS. 16 and 17 can be applied to the description of the first sub-pads 4242*a*. That is, at least one of the embodiments and the modified examples described with reference to FIGS. 16 and 17 can be applied to the first sub-pads 4242*a*, and a detailed description thereof is omitted.

In the present embodiment, the number of first end pads 424*a* is more than the number of first extension pads 424*b*. A total length L20 (i.e., a distance between both ends (or opposite ends) of the first extension pad 424*b* in the second direction) of the first extension pad 424*b* can be greater than a total length L10 (i.e., a distance in the second direction between both ends (or opposite ends) of two first sub-pads 4242*a* positioned on the outermost side among a plurality of first sub-pads 4242*a* constituting the first end pad 424*a*) of the first end pad 424*a*. In this instance, a sum (i.e., the length L20 of the first extension pad 424*b*) of total overlapping areas or total overlapping lengths of the wiring member 142 and the first extension pad 424*b* can be greater than a sum (i.e., a sum of lengths L11 of the plurality of first sub-pads 4242*a*) of total overlapping areas or total overlapping lengths of the wiring member 142 and the first end pad 424*a*. That is, a sum of total overlapping areas or total overlapping lengths of the wiring member 142 and the first extension pad 424*b* can be greater than a sum of total areas or total lengths of the first end pad 424*a*. Hence, an adhesion of the first extension pad 424*b* can be increased further than that of the first end pad 424*a* by increasing the total length L20 and the total overlapping lengths of the first extension pad 424*b* while reducing the cost and minimizing a shading loss by minimizing the area of the first end pad 424*a*.

However, embodiments are not limited thereto. For example, a sum (i.e., a sum of lengths L21 of the plurality of first sub-pads 4242*a*) of total overlapping areas or total overlapping lengths of the wiring member 142 and the first end pad 424*a* can be equal to or greater than a sum (i.e., the length L10 of the first extension pad 424*b*) of total overlapping areas or total overlapping lengths of the wiring member 142 and the first extension pad 424*b*. That is, a sum of total formation areas or total formation lengths of the first end pad 424*a* can be equal to or greater than a sum of total formation areas or total formation lengths of the first extension pad 424*b*.

Even in this case, an adhesion of the first extension pad 424*b* can be greater than an adhesion of the first end pad 424*a* by adjusting the length L11 of each of the first sub-pads 4242*a* constituting the first end pad 424*a*, and a distance between the first sub-pads 4242*a*. For example, the first end pad 424*a* can have the adhesion less than the adhesion of the first extension pad 424*b* by reducing the length L11 of each first sub-pad 4242*a* to a predetermined level or less and increasing the distance between the first sub-pads 4242*a* to a predetermined level or more. Hence, the cost and the shading loss can be reduced by reducing the area of the first end pad 424*a*.

Figure 19:
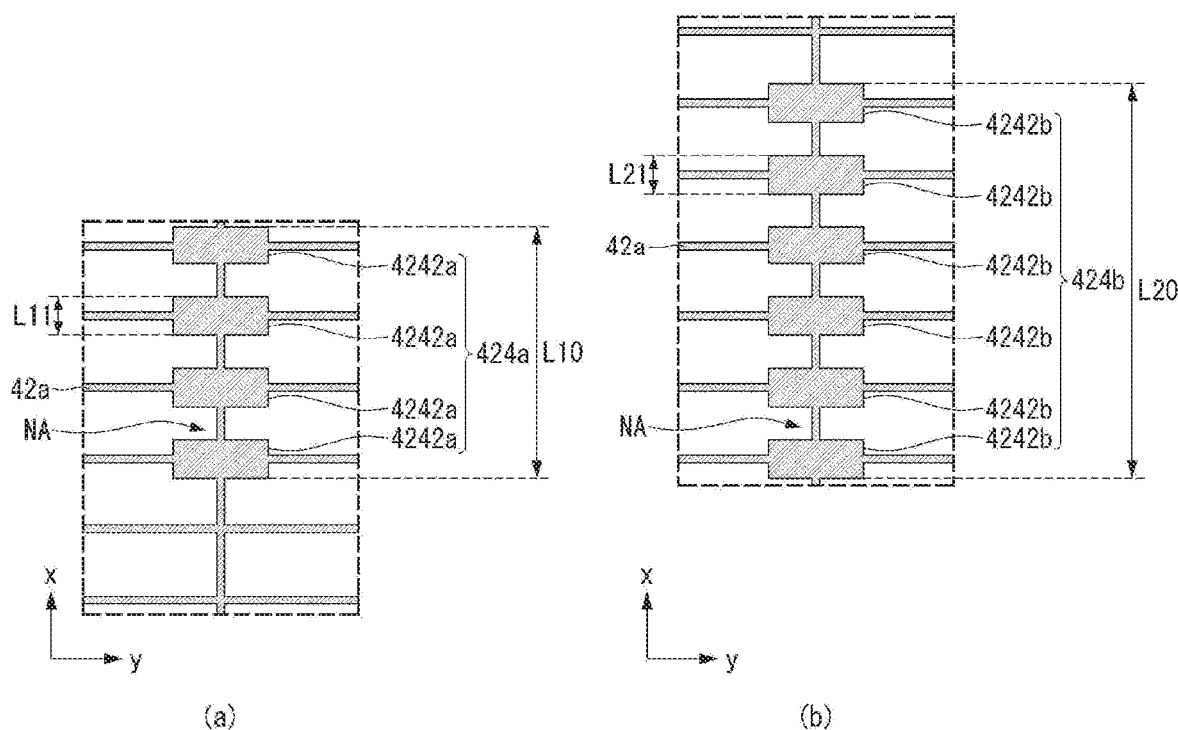
FIG. 19 is a partial plan view illustrating a part of a solar cell that can be included in a solar cell panel according to another embodiment of the invention.

FIG. 19 is a partial plan view illustrating a part of a solar cell according to another embodiment of the invention. More specifically, in FIG. 19, (a) illustrates an enlarged view of a portion including a first end pad 424*a*, and (b) illustrates an enlarged view of a portion including a first extension pad 424*b*.

Referring to (a) and (b) of FIG. 19, a first end pad 424*a* and a first extension pad 424*b* can respectively include first and second sub-pads 4242*a* and 4242*b* that are spaced apart from each other with a non-formation portion NA of a distance or a length smaller than an average distance of first inner pads 426 in the second direction. The description described with reference to FIGS. 16 to 18 can be applied to the description of the first and second sub-pads 4242*a* and 4242*b*. That is, at least one of the embodiments and the modified examples described with reference to FIGS. 16 to 18 can be applied to the first and second sub-pads 4242*a* and 4242*b*, and a detailed description thereof is omitted.

In the present embodiment, the number of first extension pads 424*b* can be more than the number of first end pads 424*a*. A total length L20 (i.e., a distance in the second direction between both ends (or opposite ends) of two second sub-pads 4242*b* positioned on the outermost side among a plurality of second sub-pads 4242*b* constituting the first extension pad 424*b*) of the first extension pad 424*b* can be greater than a total length L10 (i.e., a distance in the second direction between both ends (or opposite ends) of two first sub-pads 4242*a* positioned on the outermost side among a plurality of first sub-pads 4242*a* constituting the first end pad 424*a*) of the first end pad 424*a*. In this instance, a sum (i.e., a sum of lengths L21 of the plurality of second sub-pads 4242*b*) of total overlapping areas or total overlapping lengths of the wiring member 142 and the first extension pad 424*b* can be greater than a sum (i.e., a sum of lengths L11 of the plurality of first sub-pads 4242*a*) of total overlapping areas or total overlapping lengths of the wiring member 142 and the first end pad 424*a*. That is, a sum (i.e., a sum of lengths L21 of the plurality of second sub-pads 4242*b*) of total formation areas or total formation lengths of the first extension pad 424*b* can be greater than a sum (i.e., a sum of lengths L11 of the plurality of first sub-pads 4242*a*) of total formation areas or total formation lengths of the first end pad 424*a*. Hence, an adhesion of the first extension pad 424*b* can be increased further than that of the first end pad 424*a* by increasing the total length L20 and the total overlapping length of the first extension pad 424*b* while reducing the cost and minimizing a shading loss by reducing the areas of the first end pad 424*a* and the first extension pad 424*b*.

An area or a length of each second sub-pad 4242*b* can be greater than, equal to, or less than an area or a length of each first sub-pad 4242*a*. If the area or the length of each second sub-pad 4242*b* is greater than the area or the length of each first sub-pad 4242*a*, the adhesion of the first extension pad 424*b* can be more greatly improved, and the area of the first end pad 424*a* can be reduced. If the area or the length of each second sub-pad 4242*b* is equal to the area or the length of each first sub-pad 4242*a*, the first and second sub-pads 4242*a* and 4242*b* can be formed to a uniform size, and the stability of the above-described structure can be improved. Even if the area or the length of each second sub-pad 4242*b* is less than the area or the length of each first sub-pad 4242*a*, the first extension pad 424*b* can have the adhesion greater than the first end pad 424*a* even with the minimum area by increasing the total adhesive area due to an increase in the total length L20 and/or the number.

The present embodiment described that a pitch or a distance of the second sub-pad 4242*b* is equal to a pitch or a distance of the first sub-pad 4242*a*. However, embodiments are not limited thereto. If the pitch or the distance of the second sub-pad 4242*b* is greater than the pitch or the distance of the first sub-pad 4242*a*, the adhesion of the first extension pad 424*b* can be more greatly improved by increasing the total length L20 of the first extension pad 424*b*, and the area of the first end pad 424*a* can be reduced. If the pitch or the distance of the second sub-pad 4242*b* is equal to the pitch or the distance of the first sub-pad 4242*a*, the first and second sub-pads 4242*a* and 4242*b* can be formed to a uniform pitch or distance, and the stability of the above described structure can be improved. If the pitch or the distance of the second sub-pad 4242*b* is less than the pitch or the distance of the first sub-pad 4242*a*, the first extension pad 424*b* can have the adhesion greater than the first end pad 424*a* by minimizing the non-formation portion NA contacting the wiring member 142.

Figure 20:
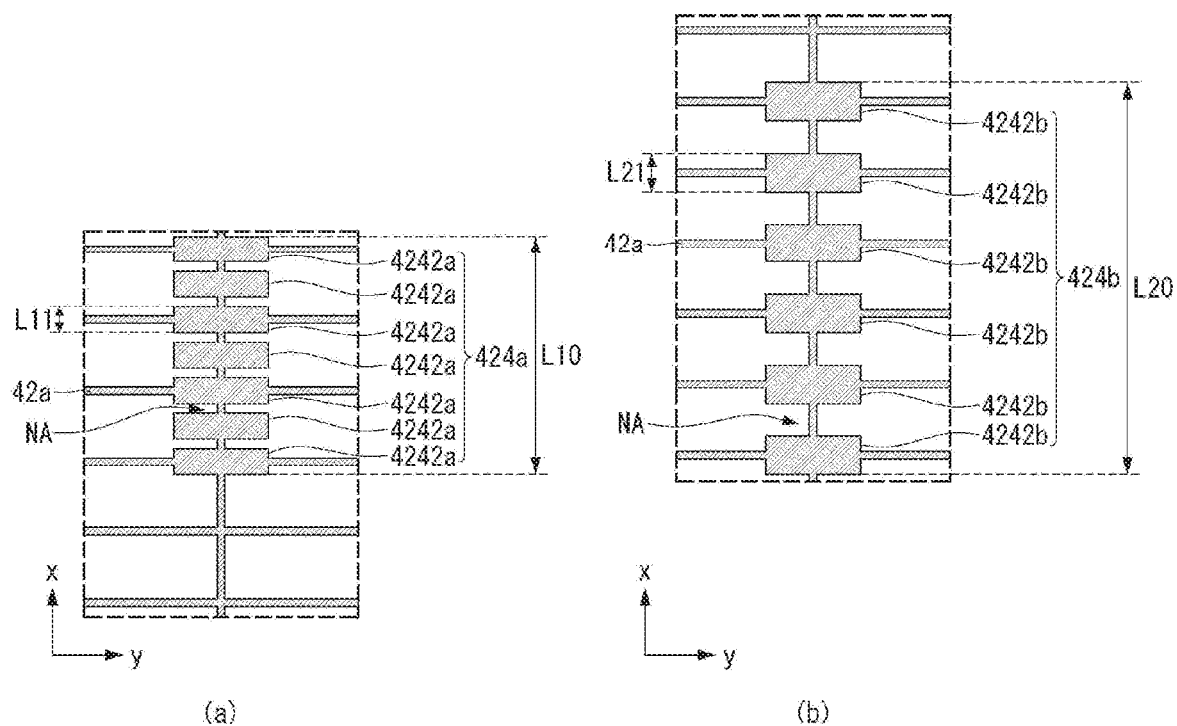
FIG. 20 is a partial plan view illustrating a part of a solar cell that can be included in a solar cell panel according to another embodiment of the invention.
Figure 21:
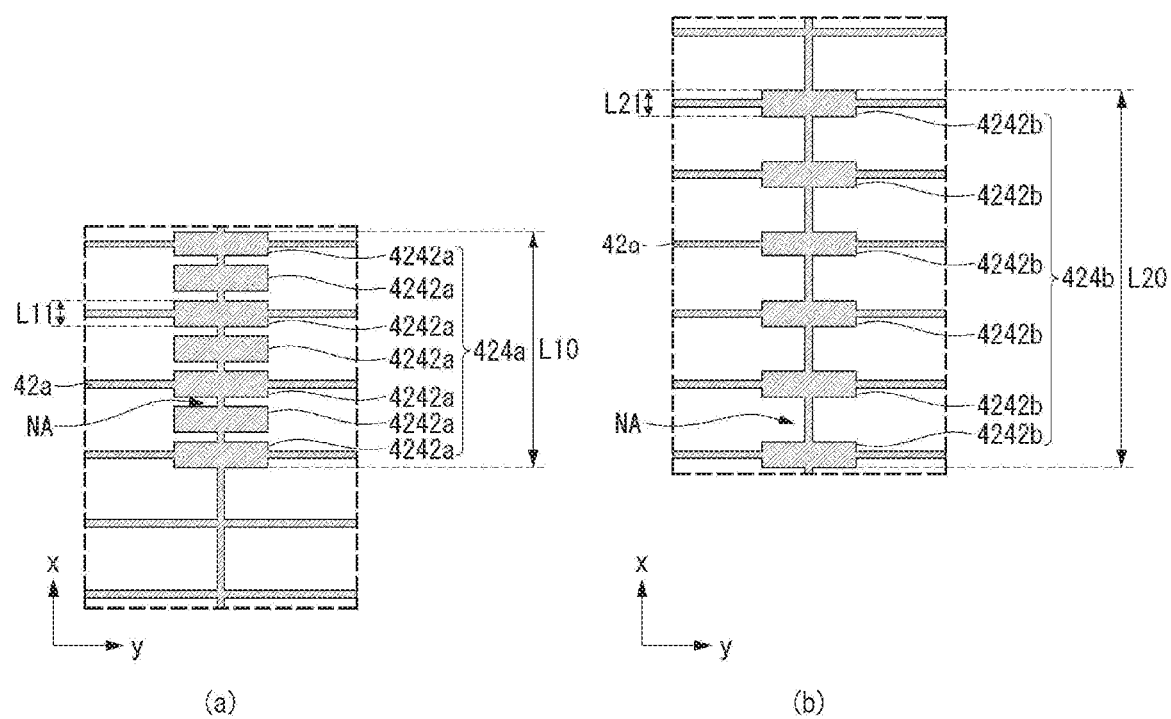
FIG. 21 is a partial plan view illustrating a part of a solar cell that can be included in a solar cell panel according to another embodiment of the invention.

FIG. 20 is a partial plan view illustrating a part of a solar cell according to another embodiment of the invention. More specifically, in FIG. 20, (a) illustrates an enlarged view of a portion including a first end pad 424*a*, and (b) illustrates an enlarged view of a portion including a first extension pad 424*b*.

Referring to (a) and (b) of FIG. 20, a first end pad 424*a* and a first extension pad 424*b* can respectively include first and second sub-pads 4242*a* and 4242*b* that are spaced apart from each other with a non-formation portion NA of a distance or a length smaller than an average distance of first inner pads 426 in the second direction. The description described with reference to FIGS. 16 to 19 can be applied to the description of the first and second sub-pads 4242*a* and 4242*b*. That is, at least one of the embodiments and the modified examples described with reference to FIGS. 16 to 19 can be applied to the first and second sub-pads 4242*a* and 4242*b*, and a detailed description thereof is omitted.

In the present embodiment, the number of first end pads 424*a* can be equal to the number of first extension pads 424*b*. A total length L20 (i.e., a distance in the second direction between both ends (or opposite ends) of two second sub-pads 4242*b* positioned on the outermost side among a plurality of second sub-pads 4242*b* constituting the first extension pad 424*b*) of the first extension pad 424*b* can be greater than a total length L10 (i.e., a distance in the second direction between both ends (or opposite ends) of two first sub-pads 4242*a* positioned on the outermost side among a plurality of first sub-pads 4242*a* constituting the first end pad 424*a*) of the first end pad 424*a*. In this instance, a sum (i.e., a sum of lengths L21 of the plurality of second sub-pads 4242*b*) of total overlapping areas or total overlapping lengths of the wiring member 142 and the first extension pad 424*b* can be equal to or greater than a sum (i.e., a sum of lengths L11 of the plurality of first sub-pads 4242*a*) of total overlapping areas or total overlapping lengths of the wiring member 142 and the first end pad 424*a*. That is, a sum of total formation areas or total formation lengths of the first extension pad 424*b* can be equal to or greater than a sum of total formation areas or total formation lengths of the first end pad 424*a*. Hence, an adhesion of the first extension pad 424*b* can be increased further than that of the first end pad 424*a* by increasing the total length L20 and the total overlapping length of the first extension pad 424b while reducing the cost and minimizing a shading loss by reducing the areas of the first end pad 424a and the first extension pad 424b.

An area or a length of each second sub-pad 4242b can be greater than, equal to, or less than an area or a length of each first sub-pad 4242a. As illustrated in FIG. 20, if the area or the length of each second sub-pad 4242b is greater than the area or the length of each first sub-pad 4242a, the adhesion of the first extension pad 424b can be more greatly improved, and the area of the first end pad 424a can be reduced. As illustrated in (a) and (b) of FIG. 21 if the area or the length of each second sub-pad 4242b is equal to the area or the length of each first sub-pad 4242a, the first and second sub-pads 4242a and 4242b can be formed to a uniform size, and the stability of the above-described structure can be improved. In this case, a sum of total overlapping areas or total overlapping lengths of the wiring member 142 and the first extension pad 424b is equal to a sum of total overlapping areas or total overlapping lengths of the wiring member 142 and the first end pad 424a. However, the distance between the second sub-pads 4242b is greater than the distance between the first sub-pads 4242a within a range that the adhesion is not reduced, and thus the first extension pad 424b can have the adhesion greater than the first end pad 424a due to an increase in its total length L20. Further, even if the area or the length of each second sub-pad 4242b is less than the area or the length of each first sub-pad 4242a, the distance between the second sub-pads 4242b can be greater than the distance between the first sub-pads 4242a within a range that the adhesion is not reduced. Hence, the first extension pad 424b with the minimized area can have the adhesion greater than the first end pad 424a by increasing its total length L20.

Figure 22:
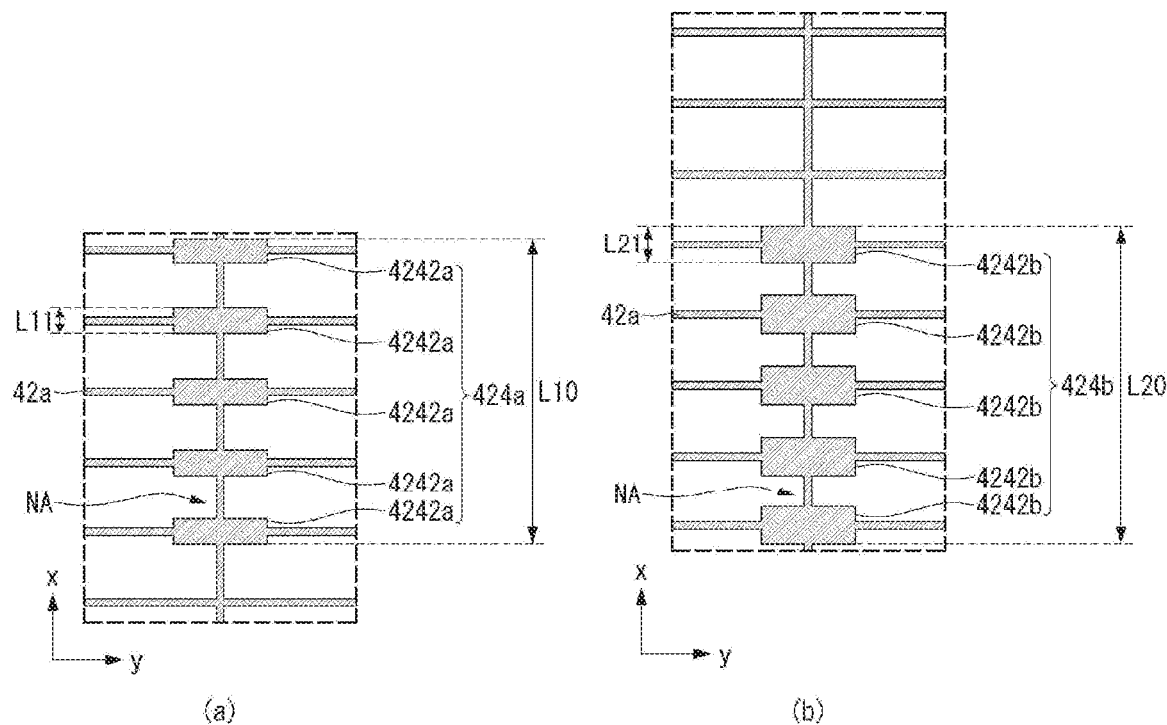
FIG. 22 is a partial plan view illustrating a part of a solar cell that can be included in a solar cell panel according to another embodiment of the invention.

FIG. 22 is a partial plan view illustrating a part of a solar cell according to another embodiment of the invention. More specifically, in FIG. 22, (a) illustrates an enlarged view of a portion including a first end pad 424a, and (b) illustrates an enlarged view of a portion including a first extension pad 424b.

Referring to (a) and (b) of FIG. 22, a first end pad 424a and a first extension pad 424b can respectively include first and second sub-pads 4242a and 4242b that are spaced apart from each other with a non-formation portion NA of a distance or a length smaller than an average distance of first inner pads 426 in the second direction. The description described with reference to FIGS. 16 to 21 can be applied to the description of the first and second sub-pads 4242a and 4242b. That is, at least one of the embodiments and the modified examples described with reference to FIGS. 16 to 21 can be applied to the first and second sub-pads 4242a and 4242b, and a detailed description thereof is omitted.

In the present embodiment, a total length L10 of a first end pad 424a can be equal to a total length L20 of a first extension pad 424b, arid a sum of total overlapping areas or total overlapping lengths of the wiring member 142 and the first extension pad 424b can be equal to or greater than a sum of total overlapping areas or total overlapping lengths of the wiring member 142 and the first end pad 424a. That is, a sum of total areas or total lengths of the first extension pad 424b can be equal to or greater than a sum of total areas or total lengths of the wiring member 142 and the first end pad 424a. Then, since the first end pad 424a and the first extension pad 424b have the same total length (L10 and L20) and have a symmetrical structure, the structural stability can be improved. Further, the adhesion of the first extension pad 424b can be increased further than the adhesion of the first end pad 424a by increasing a sum of total overlapping areas or total overlapping lengths of the first extension pad 424b.

In this instance, as illustrated in FIG. 22, an area or a length of each second sub-pad 4242b can be greater than an area or a length of each first sub-pad 4242a. Alternatively, a distance between the second sub-pads 4242b can be less than a distance between the first sub-pads 4242a, and the number of second sub-pads 4242b can be greater than the number of first sub-pads 4242a. A sum of total overlapping areas or total overlapping lengths of the first extension pad 424b can be greater than a sum of total overlapping areas or total overlapping lengths of the first end pad 424a by various other methods.

As described above, the first extension pad 424b is configured such that the number of first extension pads 424b is more than the number of first end pads 424a, or the outer area or the total length of the first extension pad 424b is greater than that of the first end pad 424a, and/or the sum of the total overlapping areas (or total overlapping lengths) or the sum of the total formation areas (or total formation lengths) of the first extension pad 424b is greater than that of the first end pad 424a, and thus the first extension pad 424b can have the excellent adhesion.

In embodiments, an adhesive property between the first extension pad 424b and the wiring member 142, or between the second extension pad 444a and the wiring member can be improved by an increase in the area of the first extension pad 424b or the second extension pad 444a as shown in FIGS. 7-11. Additionally, in embodiments, the adhesive property between the first extension pad 424b and the wiring member 142, or between the second extension pad 444a and the wiring member 142 can be improved by an increase in amount or number of contact points therebetween as shown in FIGS. 16-22. In other embodiments, an amount of contact or the number of contacts between the first extension pad 424b and the wiring member 142, or between the second extension pad 444a and the wiring member 142 can be utilized to improve the adhesive property. In the embodiments of FIGS. 16-22, the amount of contact, the number of contacts, or both are utilized to improve the adhesive property.

The features, structures, effects and the like according to the above-described embodiments are included in at least one embodiment of the invention and are not necessarily limited to one embodiment. Further, the features, structures, effects and the like illustrated in the embodiments can be combined and modified by other persons skilled in the art to which the embodiments belong. Therefore, it is to be understood that embodiments of the invention are not limited to these embodiments.

What is claimed is:

1. A solar cell panel, comprising:
a first solar cell and a second solar cell, wherein:
each of the first and the second solar cells has a first edge and a second edge opposite the first edge in a first direction along a first axis of the solar cell, wherein a second axis of the solar cell is perpendicular to the first axis;
each of the first and the second solar cells comprises a semiconductor substrate, a conductive region, and an electrode in a stacked relationship, the electrode electrically connected to the conductive region;
each electrode comprises finger lines that each extend parallel to the second axis and bus bars that each extend in the first direction and electrically connect to the finger lines;

each of the bus bars comprises an extension pad adjacent the second edge of the solar cell, an end pad adjacent the first edge of the solar cell, and a plurality of intermediate pads between the end pad and the extension pad; and for each bus bar, the extension pad is greater in surface area than the end pad, and the end pad is greater in surface area than each of the intermediate pads; and a wiring member for each of the bus bars, each wiring member:

having a proximal end portion soldered to the end pad;

being soldered to each of the intermediate pads and the extension pad; and having a distal end portion extending beyond the second edge of the solar cell and connecting to an electrode of an adjacent solar cell of the solar panel.

2. The solar cell panel of claim 1, wherein at least one of the end pad or the extension pad includes a plurality of sub-pads that have a pitch no greater than a pitch of the finger lines.

3. The solar cell panel of claim 1, wherein the conductive region is a first conductive region and the electrode is a first electrode, and each of the first and second solar cells further comprises:

a second conductive region positioned opposite the semiconductor substrate from the first conductive region; and a second electrode electrically connected to the second conductive region;

each second electrode comprises finger lines that each extend parallel to the second axis and bus bars that each extend parallel to the first axis and electrically connect to the finger lines;

each of the bus bars of the second electrode comprises an extension pad adjacent the first edge of the solar cell, an end pad adjacent the second edge of the solar cell, and a plurality of intermediate pads between the end pad and the extension pad;

wherein, for each bus bar of the second electrode, the extension pad is greater in surface area than the end pad, and the end pad is greater in surface area than each of the intermediate pads.

4. The solar cell panel of claim 1, wherein a number of the plurality of wiring members per solar cell is 6 to 33.

5. The solar cell panel of claim 1, wherein a width of each wiring member is greater than a width of the finger lines in the first direction and is less than a width of the extension, end, and intermediate pads in a direction of the second axis.

6. The solar cell panel of claim 1, wherein, for each wiring member, the extension pad is the last pad that contacts the wiring member before the wiring member extends beyond the second edge of the solar cell.

7. The solar cell panel of claim 1, wherein the first edge of each of the first and the second solar cells is a cutting surface that separates the first and the second solar cells.

8. The solar cell panel of claim 6, wherein, for each wiring member, the end pad is the last pad that contacts the wiring member before the wiring member ends at the proximal end portion.

9. The solar cell panel of claim 1, wherein, for each wiring member, the end pad is the last pad that contacts the wiring member before the wiring member ends at the proximal end portion.

10. The solar cell panel of claim 1, wherein, for each solar cell, the first axis is a short axis of the solar cell and the second axis is a longitudinal axis of the solar cell.

11. The solar cell panel of claim 1, wherein a width of each wiring member is approximately 250 µm to 500 µm.

12. The solar cell panel of claim 1, wherein the wiring members have a cross-sectional shape including a circular or rounded inner core portion.

* * * * *